(12) United States Patent
Toyoda et al.

(10) Patent No.: US 9,183,622 B2
(45) Date of Patent: Nov. 10, 2015

(54) IMAGE PROCESSING APPARATUS

(75) Inventors: Yasutaka Toyoda, Mito (JP); Norio Hasegawa, Hinode (JP); Ryoichi Matsuoka, Yotsukaido (JP); Atsuko Yamaguchi, Kodaira (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 168 days.

(21) Appl. No.: 13/882,141

(22) PCT Filed: Oct. 26, 2011

(86) PCT No.: PCT/JP2011/074662
§ 371 (c)(1),
(2), (4) Date: Jul. 2, 2013

(87) PCT Pub. No.: WO2012/057198
PCT Pub. Date: May 3, 2012

(65) Prior Publication Data
US 2013/0279793 A1 Oct. 24, 2013

(30) Foreign Application Priority Data
Oct. 27, 2010 (JP) ................................ 2010-240254

(51) Int. Cl.
*G06K 9/00* (2006.01)
*G06T 7/00* (2006.01)
(Continued)

(52) U.S. Cl.
CPC ............... *G06T 7/0004* (2013.01); *G06T 7/001* (2013.01); *H01J 37/222* (2013.01); *H01J 37/28* (2013.01);
(Continued)

(58) Field of Classification Search
CPC .................................. H01J 37/00; G06T 7/00
USPC ........................................ 382/145; 356/237.1
See application file for complete search history.

(56) References Cited

U.S. PATENT DOCUMENTS 7,369,703 B2 * 5/2008 Yamaguchi et al. .......... 382/199
7,660,455 B2 * 2/2010 Yamamoto et al. ........... 382/141
(Continued)

FOREIGN PATENT DOCUMENTS

JP 63-223977 9/1988
JP 9-295250 A 11/1997
(Continued)

OTHER PUBLICATIONS

Office Action Japanese Patent Application No. 2013-252618 dated Jan. 20, 2015.
(Continued)

*Primary Examiner* — Abolfazl Tabatabai
(74) *Attorney, Agent, or Firm* — McDermott Will & Emery LLP

(57) ABSTRACT

An object of the present invention is to provide an image processing apparatus and a computer program which detects a defect such as a scum at high speed and with high precision. In order to accomplish the above-described object, the present invention proposes an image processing apparatus and a computer program which acquires image data, and detects edge branch points from this image data. Here, at each of the edge branch points, an edge associated therewith branches off in at least three or more directions. According to this configuration, it becomes possible to detect a defect such as a scum without utilizing the reference-pattern image. As a consequence, it becomes possible to detect the scum at high speed and with high precision.

25 Claims, 36 Drawing Sheets

(51) Int. Cl.
*H01J 37/22* (2006.01)
*H01J 37/28* (2006.01)
*G01N 21/00* (2006.01)
*H01L 21/66* (2006.01)

(52) U.S. Cl.
CPC ............ *G06T 2207/30141* (2013.01); *G06T 2207/30152* (2013.01); *H01J 2237/24578* (2013.01); *H01J 2237/24592* (2013.01); *H01J 2237/2817* (2013.01); *H01L 22/12* (2013.01); *H01L 2924/0002* (2013.01)

(56) References Cited

U.S. PATENT DOCUMENTS

| | | | |
|---|---|---|---|
| 8,311,314 B2 * | 11/2012 | Matsuoka et al. | 382/145 |
| 2008/0175469 A1 | 7/2008 | Toyoda et al. | |
| 2010/0128966 A1 | 5/2010 | Abe et al. | |

FOREIGN PATENT DOCUMENTS

| | | | |
|---|---|---|---|
| JP | 2000-180128 A | 6/2000 |
| JP | 2003-037139 A | 2/2003 |
| JP | 2007-324266 A | 12/2007 |
| JP | 2008-047664 A | 2/2008 |
| JP | 2009-222454 A | 10/2009 |
| JP | 2010-129599 A | 6/2010 |

OTHER PUBLICATIONS

Japanese Office Action issued in Japanese Patent Application No. JP 2013-252618 dated Aug. 12, 2014.
International Search Report issued in International Patent Application No. PCT/JP2011/074662 dated Feb. 7, 2012.
Decision of Rejection Japanese Application No. 2013-252618 dated Jul. 14, 2015.
Decision of Declining Amendment Japanese Patent Application No. 2013-252618 dated Jul. 14, 2015.

* cited by examiner

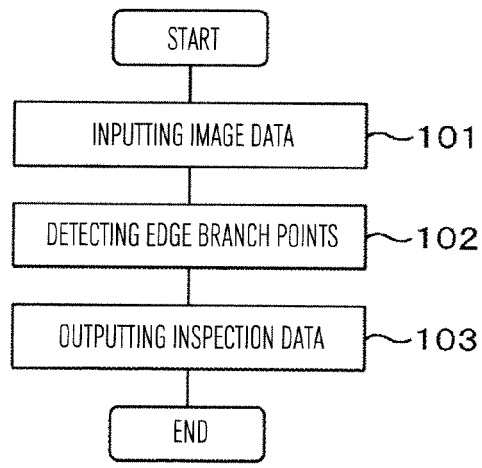
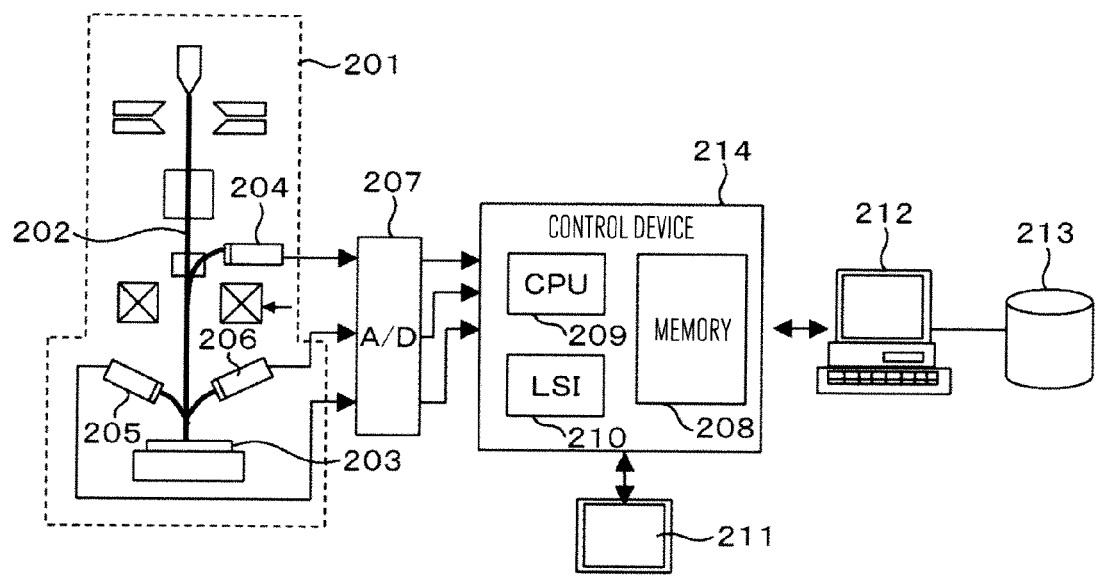

| No | ID | Address | Pattern | Pattern Shape | Scum Pattern | Connect |
|---|---|---|---|---|---|---|
| 1 | | | | | | |
| 2 | | | | | | |
| 3 | | | | | | |
| 4 | | | | | | |
| 5 | | | | | | |
| 6 | | | | | | |
| 7 | | | | | | |
| 8 | | | | | | |

FIG. 33
| DEGREE-OF-RISK LEVEL | CROSS-SECTIONAL VIEW | TOP VIEW (SEM IMAGE) |
|---|---|---|
| 0 | 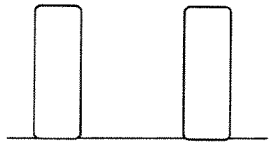 | 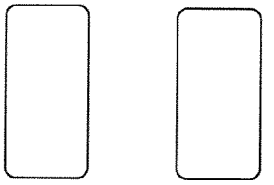 |
| 1 | 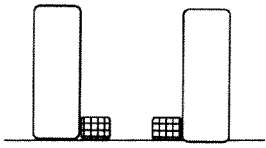 | 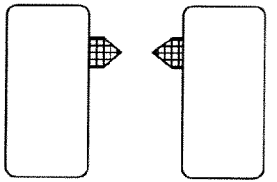 |
| 2 | 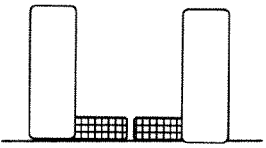 | 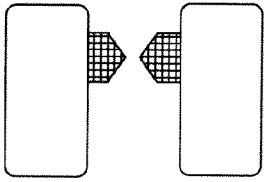 |
| 3 | 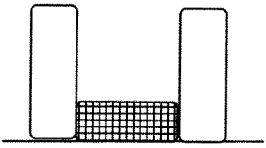 | 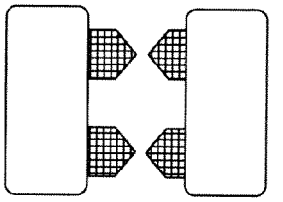 |
| 4 | 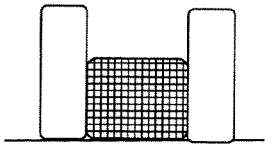 | 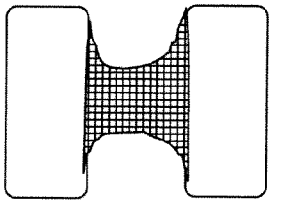 |

| DEGREE-OF-RISK LEVEL | LOWER | ⇔ | HIGHER |
| --- | --- | --- | --- |
| SCUM'S WIDTH | NARROWER | ⇔ | WIDER |
| SCUM'S HEIGHT | LOWER | ⇔ | HIGHER |

IMAGE PROCESSING APPARATUS

RELATED APPLICATIONS

This application is the U.S. National Phase under 35 U.S.C. §371 of International Application No. PCT/JP2011/074662, filed on Oct. 26, 2011, which in turn claims the benefit of Japanese Application No. 2010-240254, filed on Oct. 27, 2010, the disclosures of which Applications are incorporated by reference herein.

TECHNICAL FIELD

The present invention relates to an image processing apparatus for executing the image processing of image data acquired using devices such as a charged-particle beam device, and a computer program for implementing this image processing. More specifically, it relates to an image processing apparatus and a computer program for detecting a defect on a sample on the basis of the image data acquired.

BACKGROUND ART

In a semiconductor integrated circuit in recent years, there has been a significant development of its micro-fabricated implementation and multi-layered implementation. Also, there has been a significant increase in the complication of its logic. Accordingly, a difficult situation is now underway in which it is extremely difficult to fabricate this semiconductor integrated circuit. As a result of this difficult situation, a defect that is caused to occur by the fabrication process tends to occur frequently. Consequently, it has become important to detect this defect efficiently and precisely, and to identify problems existing in the fabrication process.

The representative defect caused to occur by the fabrication process is a scum. The scum is a thin-film-like resist that remains at the foot portion of a resist pattern after the development process is over. If the scum is caused to occur, there arises a possibility that etching of the scum portion will not be performed, and that the resist pattern will be short-circuited. This possibility makes it required to inspect such factors as the scum's occurrence position and process-condition-based occurrence frequency.

In the case of detecting a defect generally, there exists the following method therefor: Namely, the comparison is made between the shape of a normal circuit pattern (which, hereinafter, will be referred to as "a reference pattern") where no defect is caused to occur, and the shape of an inspection target's circuit pattern (which, hereinafter, will be referred to as "an inspection pattern"). Concretely, the operator selects an ideal-shape-equipped circuit pattern from among circuit patterns formed on wafers. Moreover, the operator photographs this ideal-shape-equipped circuit pattern, thereby creating the image of the reference pattern. Next, the operator photographs the inspection pattern, then performing superimposition between the inspection-pattern image and the reference-pattern image, and calculating a luminance difference between these images.

In PATENT LITERATURE 1, the disclosure has been made concerning a technology for detecting a defect by making the image comparison between the reference-pattern image and the inspection-pattern image. Here, the reference-pattern image is formed based on original design data.

CITATION LIST

Patent Literature

PATENT LITERATURE 1: JP-A-2001-338304 (U.S. Pat. No. 7,660,455)

SUMMARY OF INVENTION

Technical Problem

When a scum is contained in an inspection-target pattern, the luminance at the scum position differs from the luminance at the corresponding position of the reference-pattern image. As a result, the difference value between these luminances becomes larger as compared with the luminances at the non-scum positions. Accordingly, it is conceivable that the point on the images at which the luminance difference value is larger can be detected as the scum by taking advantage of this property.

However, in the case of inspecting a defect such as a scum by making the image comparison, photographing the reference pattern becomes necessary. This drawback makes it impossible to expect an enhancement in the inspection throughput. Also, in the case of inspecting a defect such as a scum by making the comparison between the design data and the inspection-pattern image, the essential difference therebetween (i.e., the design data is line-segment data; whereas the inspection-pattern image is luminance information) exerts an influence upon the comparison. This drawback, in some cases, makes it impossible to precisely detect a defect such as a scum. Moreover, if the scum detection using the reference pattern or the design data fails in the superimposition with the inspection-pattern image, it becomes impossible to precisely detect a defect such as a scum. Namely, it is difficult to detect a scum on the basis of the image comparison disclosed in PATENT LITERATURE 1.

Hereinafter, the explanation will be given below concerning an image processing apparatus and a computer program whose object is to detect a defect such as a scum at high speed and with high precision.

Solution to Problem

As an aspect of the present invention for accomplishing the above-described object, the present invention proposes an image processing apparatus and a computer program for acquiring image data, and detecting edge branch points from this image data. Here, at each of the edge branch points, an edge associated therewith branches off in at least three or more directions.

Advantageous Effects of Invention

According to the above-described configuration, it becomes possible to detect a defect such as a scum without utilizing the reference-pattern image. As a consequence, it becomes possible to detect the scum at high speed and with high precision.

Other objects, features and advantages of the present invention will become apparent from the following description of the embodiments of the present invention in association with the accompanying drawings.

BRIEF DESCRIPTION OF DRAWINGS

FIG. 1 This is a flowchart for explaining steps of extracting an edge branch point from image data.

FIG. 2 This is a diagram for explaining an example of the pattern measurement or inspection system including a scanning electron microscope.

FIG. 33 This is a diagram for indicating the relationship between a scum, which is caused to occur in the groove portion of a wiring pattern, and the degree-of-risk level of the scum.

DESCRIPTION OF EMBODIMENTS

Figure 3:
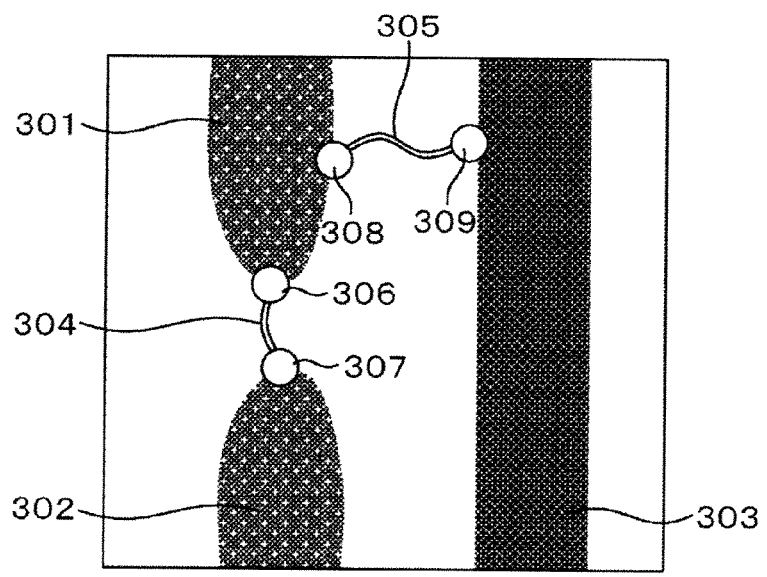
FIG. 3 This is a diagram for explaining an example of the image acquired by the scanning electron microscope.

In the case of inspecting a defect such as a scum by making the image comparison, photographing the reference pattern becomes necessary. This drawback makes it impossible to expect an enhancement in the inspection throughput. Also, in the case of inspecting a defect such as a scum by making the comparison between the design data and an inspection-pattern image, the essential difference therebetween (i.e., the design data is line-segment data; whereas the inspection-pattern image is luminance information) exerts an influence upon the comparison. This drawback, in some cases, makes it impossible to precisely detect a defect such as a scum. Moreover, if the scum detection using the reference pattern or the design data fails in the superimposition with the inspection-pattern image, it becomes impossible to precisely detect a defect such as a scum.

In view of this situation, the present embodiment mainly proposes an image processing apparatus and a computer program for acquiring image data about an electronic device, detecting edge branch points from this image data, and creating information about the edge branch points detected. Here, at each of the edge branch points, an edge associated therewith branches off in at least three or more directions.

The information mentionable as an example of the information about the above-described edge points are coordinate data on the edge points. Moreover, the information mentionable as another example of the information about the edge points is the number of the edge points.

Also, the present embodiment proposes an image processing apparatus and a computer program for identifying an inspection region of the image data corresponding to coordinate data on the electronic device, and creating the information about the edge points in such a manner as to be limited into the inspection region. Here, the occurrence of a defect is estimated beforehand within the electronic device by the design-based layout verification or model-based layout verification.

Also, as described above, concerning the identification of the inspection region, the inspection data may also be classified based on design layout data that corresponds to a circuit pattern in proximity to each edge point.

Also, a data file may also be created based on the coordinate data on the electronic device. Here, the inspection data based on the edge points of the image data is recorded into the data file.

As a more preferable embodiment, data for implementing and performing the screen display of the information about the edge points may also be created. The above-described data file may also be selected as the target of the screen display.

Incidentally, in the embodiments that will be explained hereinafter, the explanation will be given selecting, as its example, an image processing apparatus that is installed on a SEM (: Scanning Electron Microscope), or an image processing apparatus that is connected to the SEM via a communications line or the like. These embodiments, however, are not limited thereto. Namely, it is also allowable to configure these embodiments in such a manner that such processing as will be described later are performed using a general-purpose calculation device for executing the image processing on the basis of a computer program. Moreover, techniques which will be described later are also applicable thereto, when the defect detection is performed based on an image acquired using other charged-particle beam devices such as a FIB (: Focused-Ion Beam) device.

According to the present embodiment, the edge branch points, at each of which an edge associated therewith branches off in at least three or more directions, are detected from the image data acquired by photographing an electronic device. Furthermore, the inspection data based on the edge branch points are created. This inspection scheme allows execution of the precise inspection with a higher throughput as compared with the inspection that utilizes the reference-pattern image.

FIG. 2 is a schematic diagram of the configuration of a semiconductor inspection system including the SEM. The semiconductor inspection system includes the SEM 201 for acquiring the image data on a circuit pattern, and a control device 214 for detecting a defect of the circuit pattern by analyzing the image data.

In the SEM 201, a sample 203, such as a wafer on which an electronic device is fabricated, is irradiated with an electron beam 202. Next, electrons emitted from the sample 203 are captured by a secondary-electron detector 204 and backscattered-electron detectors 205 and 206, then being converted into digital signals by an A/D converter 207. Moreover, the digital signals are inputted into the control device 214, then being stored into a memory 208. In the control device 214, the digital signals are subjected to purpose-dependent image processing by a CPU 209 and image processing hardware 210 such as ASIC or FPGA. Also, the control device 214 is equipped with a function of creating a line profile on the basis of the detected signals, and measuring the dimension between peaks of the profile. Namely, the inspection system exemplified in FIG. 2 also functions as a measurement system for measuring the semiconductor device.

Furthermore, the control device 214, which is connected to an input-unit-equipped display device 211, is equipped with functions such as the GUI (: Graphical User Interface) function of displaying images and inspection results to the user.

Incidentally, a partial or entire control in the control device 214 can also be processed/controlled by being allocated to such a device as an electronic computer that mounts thereon a CPU and an image-accumulation-capable memory. Also, the control device 214 is connected to a recipe creation device 212 via such a line as a network or bus. Here, in the recipe creation device 212, a photographing recipe including a pattern-matching-dedicated template and photographing conditions, which is used for determining the electronic device's inspection coordinate and inspection position needed for the inspection, is created by a hand operation, or by making use of the design data 213 on the electronic device.

Figure 4:
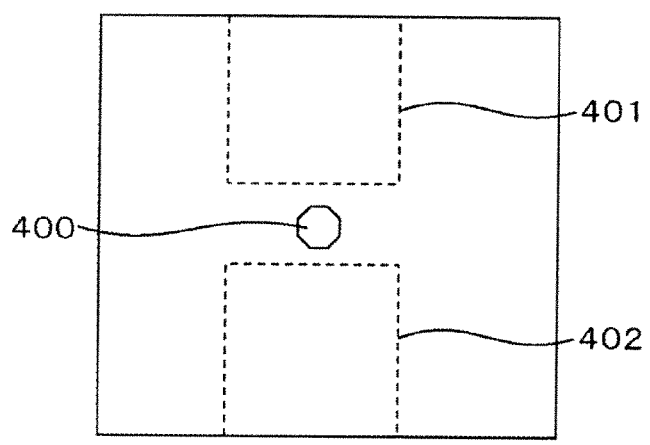
FIG. 4 This is a diagram for explaining an example where an inspection coordinate is set on design data.
Figure 7:
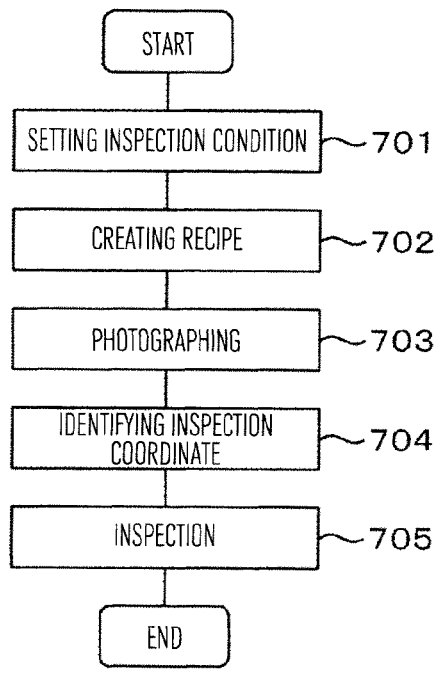
FIG. 7 This is a flowchart for explaining steps of creating a recipe on the basis of the setting for measurement or inspection conditions, and executing the measurement or inspection in accordance with the recipe.

FIG. 7 is a flowchart for exemplifying steps of creating the recipe by using the recipe creation device 212. Here, the recipe is the operation program of the SEM 201. First, the operator sets an inspection condition by using the recipe creation device 212 (step 701). The inspection condition is a condition such as photographing magnification of the SEM 201 or coordinate information on an inspection point. For example, when inspecting a scum existing between circuit patterns 401 and 402, called a "butt", illustrated in FIG. 4, the user sets coordinate information 400 as the inspection condition, while making reference to the design data. Here, the coordinate information 400 is coordinate information about the sample on which the butt-mannered circuit patterns are to be fabricated. Incidentally, it is also possible to set coordinate information at which the occurrence of a defect such as a scum is predicted by the design-rule check performed at the time of designing the semiconductor circuit, or the model-based check where the optical simulation is utilized.

Next, the operator creates the photographing recipe (step 702). The photographing recipe, which is data for controlling the SEM 201, defines therein a template or the like for identifying the inspection point from the coordinate information, magnification, and image data. Moreover, based on the photographing recipe, the operator photographs the circuit patterns with the use of the SEM 201 (step 703). Furthermore, the operator performs the pattern matching between the template such as the design data or simulation data, and the image data. In this way, the operator identifies the inspection coordinate of the image data corresponding to the coordinate information registered in the photographing recipe (step 704).

Figure 5:
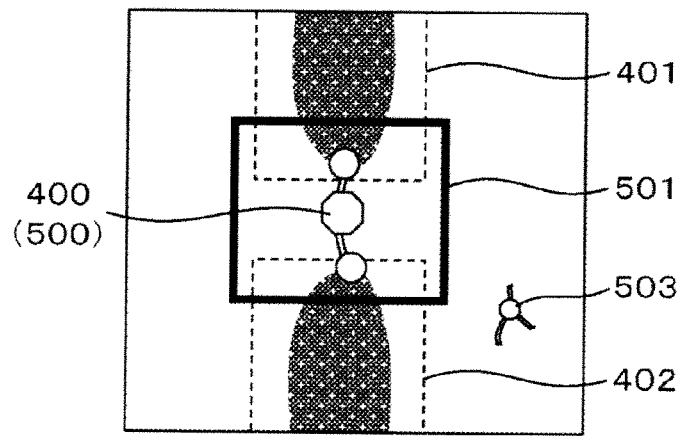
FIG. 5 This is a diagram for explaining an example where the pattern matching is performed between the design data and the image data.

FIG. 5 illustrates an example of the result of the pattern matching. The execution of the pattern matching makes it possible to identify the inspection coordinate 500 of the image data corresponding to the coordinate information 400 specified as the inspection condition.

Next, consideration is given to an area (i.e., evaluation area of an edge branch point) 501 with the inspection coordinate 500 of the image data selected as its center. At this time, the evaluation area 501 is set as a more or less wide area selectively. Here, the detection of an edge branch point, at which an edge associated therewith branches off in at least three or more directions, is executed within this evaluation area 501. Even if there occurs a shift of the pattern matching, or a deformation of the circuit patterns, this more-or-less-wide-area setting for the evaluation area 501 allows a desired inspection point to be inspected.

Also, by limiting the inspection region with the employment of an evaluation area like this, it becomes possible to prevent, e.g., the detection of a pseudo defect caused by a pseudo contour 503. Here, the pseudo contour 503 positions in the background region as illustrated in FIG. 5 where no scum is usually caused to occur. Also, the pseudo contour 503 seems to be formed by erroneously converting an intra-image-contained noise into the contour. Moreover, it becomes possible to shorten the inspection time as compared with a case where the entire surface of the image data is to be inspected.

FIG. 1 is a flowchart for indicating detection steps of detecting an edge branch point, at which an edge associated therewith branches off in at least three or more directions. A processing like this can be executed by a software processing that uses units such as the CPU 209 and the memory 208 of the control device 214. A processing like this, however, can also be executed by a software processing that uses units such as the CPU and the memory of an electronic computer which can input the image data from the SEM 201 via a LAN or bus, or via a storage medium such as mobile-type memory or hard disc. Also, a partial or entire portion of the flowchart illustrated in FIG. 1 can also be executed by the image processing hardware 210.

First, the image data on circuit patterns of an electronic device is read in (step 101). Here, the image data is photographed by the SEM 201. FIG. 3 illustrates an image example of the circuit patterns. This image example includes the three circuit patterns 301 to 303. Also, a scum 304 exists between the circuit pattern 301 and the circuit pattern 302, and a scum 305 exists between the circuit pattern 301 and the circuit pattern 303. At the edge portion of each circuit pattern, or at the edge portion of each defect, electrons are emitted in large quantities by the irradiation with the electron beam. As a result, these edge portions become high-luminance images that look like glittering in white when compared with the background region. Next, the branch points of the glittering-in-white edges are detected (step 102).

Figure 9:
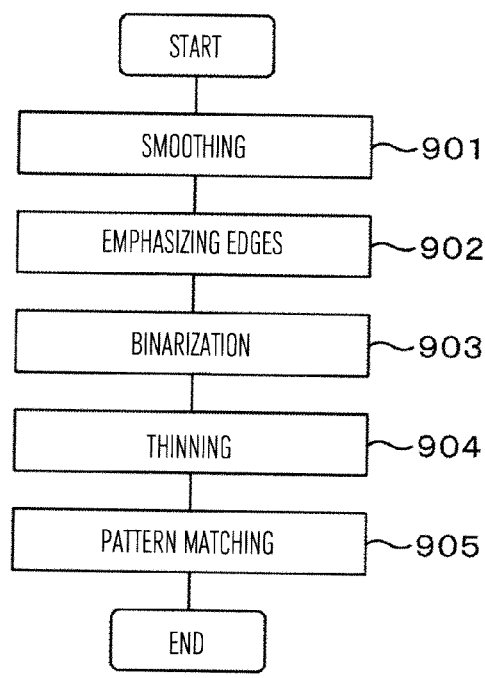
FIG. 9 This is a flowchart for explaining steps of executing the pattern matching after the pattern data is formed into a contour line.

The branch point of an edge is a section at which a circuit pattern and a scum are connected to each other. For example, the branch point of an edge is an intersection point (i.e., an edge branch point 306) of the circuit pattern 301 and the scum 304. In addition to the edge branch point 306, three edge branch points (307, 308, and 309) exist in this image. The detection of the edge branch points is performed in accordance with, e.g., processing steps illustrated in FIG. 9.

Figure 10:
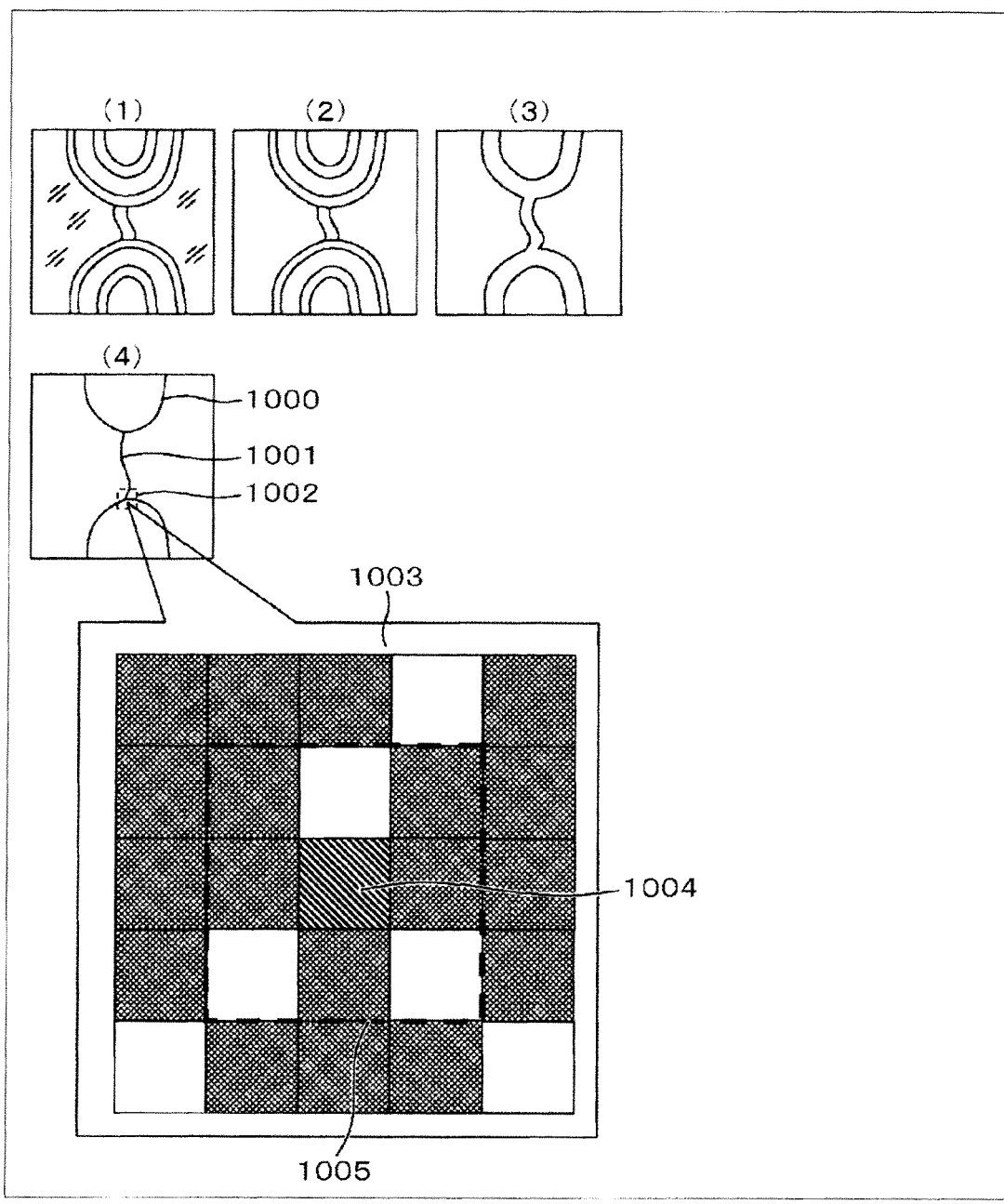
FIG. 10 This is a diagram for explaining the detection steps of detecting the edge branch point.

Hereinafter, using image data illustrated in FIG. 10, the explanation will be given below concerning an example of detection steps of detecting edge branch points. First, a filtering based on a smoothing operator ("Computer Image Processing", Ohm Corp. p. 110) is applied to image data ((1) in FIG. 10) acquired by the SEM 201. This filtering suppresses a noise contained in the image data (step 901). Next, a filtering based on a line-detecting operator ("Computer Image Processing", Ohm Corp. p. 200) is applied to the image data smoothed. This filtering emphasizes edges (step 902). The noise is superimposed on the image data acquired by the SEM 201. Accordingly, the application of filtering processing like these makes it possible to create image data ((2) in FIG. 10), where the edges of circuit patterns and the edges of a scum are emphasized.

Next, a binarization processing ("Computer Image Processing", Ohm Corp. p. 138 to 142) is applied to the image data after being edges-emphasized, using a threshold value that is determined by a fixed threshold value or the image analysis (step 903). This binarization processing creates binarized image data ((3) in FIG. 10), where the portions of the edges are converted into white pixels.

Next, a thinning processing is applied to the image data after being binarized (step 904). This thinning processing allows the creation of contour data ((4) in FIG. 10). Here, the contour data expresses the edges as 1-pixel-width edges. Next, the pattern matching between edge branch patterns and the contour data is performed, thereby detecting the edge branch points contained in the contour data (step 905). The pattern matching is a technique for searching for a location where there exists a specific-shaped pattern that can be regarded as the same shape as the reference-pattern image (which is referred to as "the template").

Figure 11:
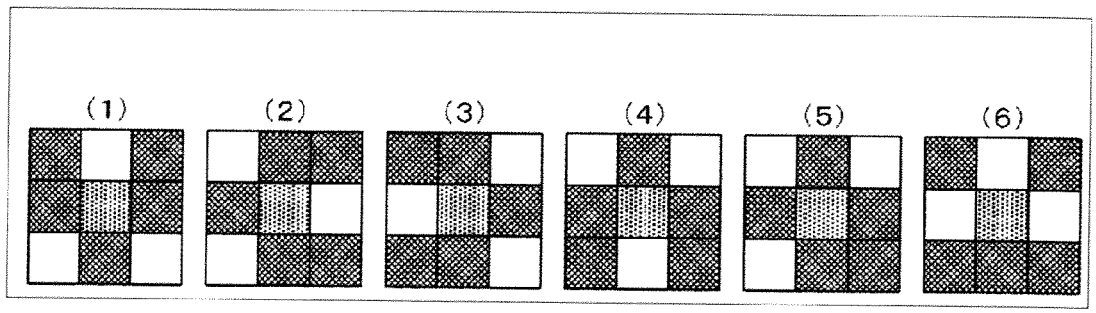
FIG. 11 This is a diagram for indicating a template group used for detecting the edge branch point.

The edge branch patterns, which are illustrated in, e.g., FIG. 11 (only their representative examples are illustrated), are binarized image templates for indicating the contour shapes of the connection portion of a circuit pattern and a defect. A reference numeral 1003 denotes an enlarged view of the connection portion 1002 of the circuit pattern 1000 and the scum 1001 in the contour data ((4) in FIG. 10). The contour shape of a pixel region 1005 of 3×3 pixels with the edge branch point 1004 positioned at its center coincides with one pattern (i.e., (1) in FIG. 11) of the edge branch patterns.

The pattern matching with the contour data is performed, using a plurality of edge branch patterns like this that coincide with the contour shapes of edge branch points. This method makes it possible to detect the edge branch points contained in the contour data. Incidentally, the contour lines illustrated in (4) in FIG. 10 are expressed with the black lines for making the visual recognition easy. Meanwhile, when templates as are exemplified in FIG. 11 are used, it is advisable to express the contour-line portions in white.

Figure 24:
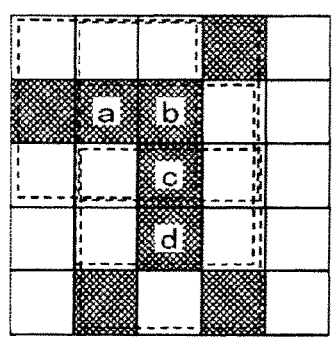
FIG. 24 This is a diagram for explaining the detection of edge branch points based on the edge searching.

Incidentally, edge branch points can also be detected by counting the number of edge's pixels within a predetermined region, and making the judgment on this number. FIG. 24 is a diagram for indicating a pattern of edge branch points. Reference notations b and d in the drawing indicate the occurrence points of scums. First, the positions (: black rectangular portions) of the edge's pixels are detected from the image data. These edge's pixels will be referred to as "attention pixels". Next, the number of the edge's pixels is counted which exist within 3×3 pixels with an attention pixel positioned at its center. Then, if the number of the edge's pixels excluding the attention pixel is found to be larger than 3, this attention pixel is judged to be an edge branch point. Each of reference notations a, b, c, and d in FIG. 24 is a point at which three or more edge's pixels exist within 3×3 pixels with its own pixel positioned at its center. In the case of this edge-branch-points detection method, as compared with the above-described template-utilized case, the points like a and c where the scum and the patterns exist in a mixed manner are also detected as edge branch points. In the case of approximately grasping a scum's occurrence position, however, this edge-branch-points detection method allows implementation of the higher-speed processing as compared with the template-utilized case. This means that this detection method is effective in this case.

Figure 8:
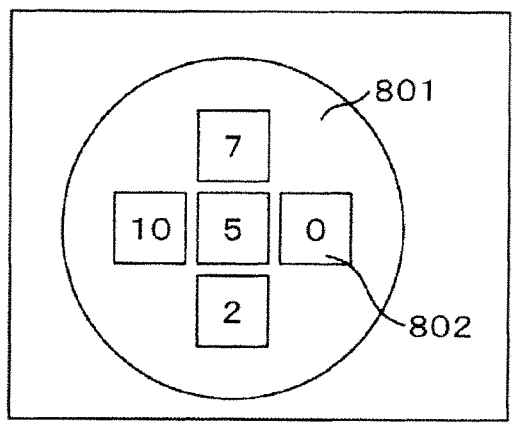
FIG. 8 This is a diagram for explaining a displayed example of the output data.

Finally, the number of the detected edge branch points and the coordinate information are outputted, as the inspection data, to the memory 208 and the display device 211 (step 103). FIG. 8 illustrates an outputted example of the inspection data to the display device 211. This is a picture for drawing a map 801 and the edge branch points' number 802. Here, the map 801 indicates the wafer on which the electronic device is fabricated, and the edge branch points' number 802 is detected at each point corresponding to the inspection coordinate on the map 801. A picture like this is created as the inspection data, then being presented to the operator. This presentation allows the operator to easily confirm the scum's detection positions and occurrence situation within the wafer surface.

Also, like the present embodiment, the template-utilized detection of the edge branch points is performed after the SEM image is formed into the contour line. This scheme makes it possible to suppress the number of the templates that should be prepared. Also, this scheme allows execution of the high-precision detection of a scum portion. Namely, the execution of the contour-line formation results in a simplification of the shape of the scum portion. This situation makes it unnecessary to prepare a large number of templates so as to address the complicated edge shape. Also, this situation results in the matching between the equally simple shapes, thereby allowing execution of the high-precision identification of the scum portion.

Next, the explanation will be given below concerning an inspection method that allows the identification of the type of a circuit pattern in which a scum is likely to occur. In this inspection method, the identification of this circuit-pattern type is made possible as follows: Namely, using the design data on an electronic device of the inspection target, or process simulation data based on the optical simulation (hereinafter, the explanation will be given employing the design data in order to simplify the sentence), the type information on this circuit pattern is acquired by analyzing this design data. Moreover, the inspection result is classified using this type information, thereby identifying the circuit-pattern type.

Figure 6:
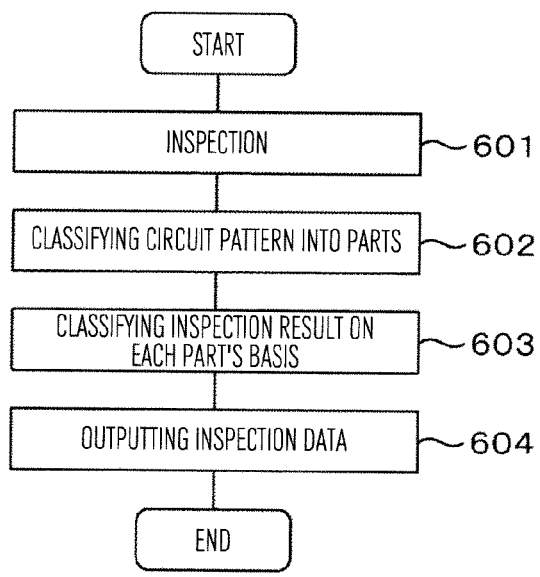
FIG. 6 This is a flowchart for explaining steps of classifying output data on each pattern's part (i.e., section) basis.
Figure 12:
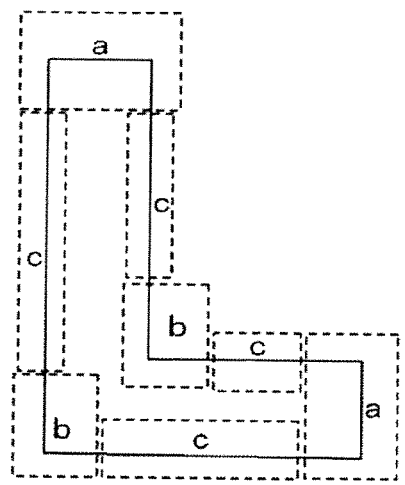
FIG. 12 This is a diagram for explaining an example where the parts of the design data are classified.

FIG. 6 is a flowchart for the present embodiment. First, the inspection explained in the first embodiment is performed (step 601). Next, the shape of the design data used for the pattern matching is analyzed, thereby classifying this shape into parts whose shapes are different from each other (step 602). As illustrated in FIG. 12, these shapes-different parts are such parts as a line's front-end section (a), line's corner section (b), and line's straight-line section (C). The design data is generally data about coordinate group for expressing the circuit shape with lines. Accordingly, analyzing the relationship of a plurality of continuous line-segments makes it possible to easily perform the classification as described above. Next, the parts of the design data in proximity to the detected edge branch points are identified at the superimposition points acquired by the pattern matching. Then, the inspection data is classified on each part's type basis (step 603). Finally, the inspection data classified is outputted to the display device 211 or the memory 208. The display of the classified inspection data is performed in such a manner that the edge branch points' number 802 illustrated in FIG. 8 is displayed on each circuit-pattern type basis.

Based on the classification of the inspection data like this, for example, a scum caused to occur at the line's front-end section, and a scum caused to occur at the line's straight-line section can be detected as mutually different defects. This feature allows the operator to easily identify the section of a circuit pattern in which a scum is likely to occur.

According to the configuration described so far, edges are detected from the image data acquired by photographing an electronic device. Moreover, an edge branch point, at which an edge associated therewith branches off in at least three or more directions, is detected from the edges. Furthermore, the inspection data based on the edge branch point is created. This scheme makes it possible to perform the higher-throughput and more-precise inspection as compared with the defect-inspecting method that utilizes the reference-pattern image.

Figure 13:
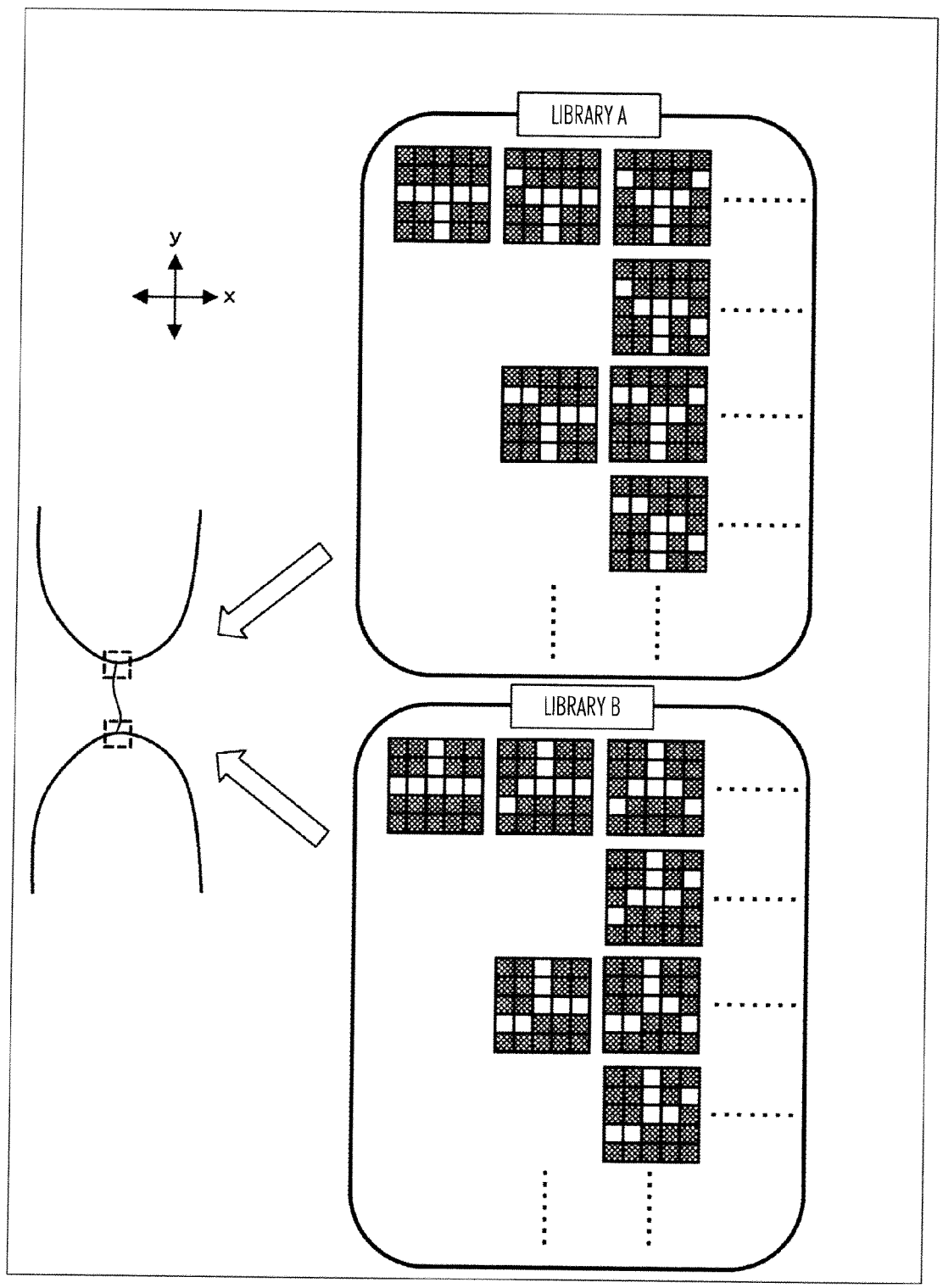
FIG. 13 This is a diagram for explaining an example where edge branch points are detected by using templates that are included in a plurality of libraries provided on each scum's direction basis.

Next, referring to FIG. 13 and FIG. 14, the explanation will be given below concerning another technique of classifying the pattern of a scum. FIG. 13 is a diagram for explaining the following example: Namely, a library is provided for each of templates whose shapes are different from each other. Also, there exists a template that establishes the matching with the scum contained in contour-line data. Moreover, the pattern of the scum is classified in correspondence with a library to which the template belongs. In the example illustrated in FIG. 13, a library A registers therein templates for detecting an edge branch point in the following case: Namely, the contour line equivalent to a pattern edge is formed in a manner of extending in the X direction, and the scum is formed in a manner of extending in the Y direction, more concretely, in the downward direction. Also, a library B registers therein templates for detecting an edge branch point in the following case: Namely, the contour line equivalent to a pattern edge is formed in a manner of extending in the X direction, and the scum is formed in a manner of extending in the Y direction, more concretely, in the upward direction.

It is conceivable that the scum identified by the template included in the library A is formed, e.g., at the pattern's end portion on the upper side of a butt-mannered pattern that is exemplified in FIG. 13. Also, the scum identified by the template included in the library B is formed, e.g., at the pattern's end portion on the lower side of the butt-mannered pattern.

In this way, the edge branch state changes on each pattern's section basis. This condition makes it possible to classify the pattern of a scum in dependence with the type of the library. A technique like this allows the classification of a scum to be performed without the necessity of making reference to the design data. Also, the more-detailed classification may be performed by co-using the design-data-based classification and the library-type-dependent classification.

Figure 14:
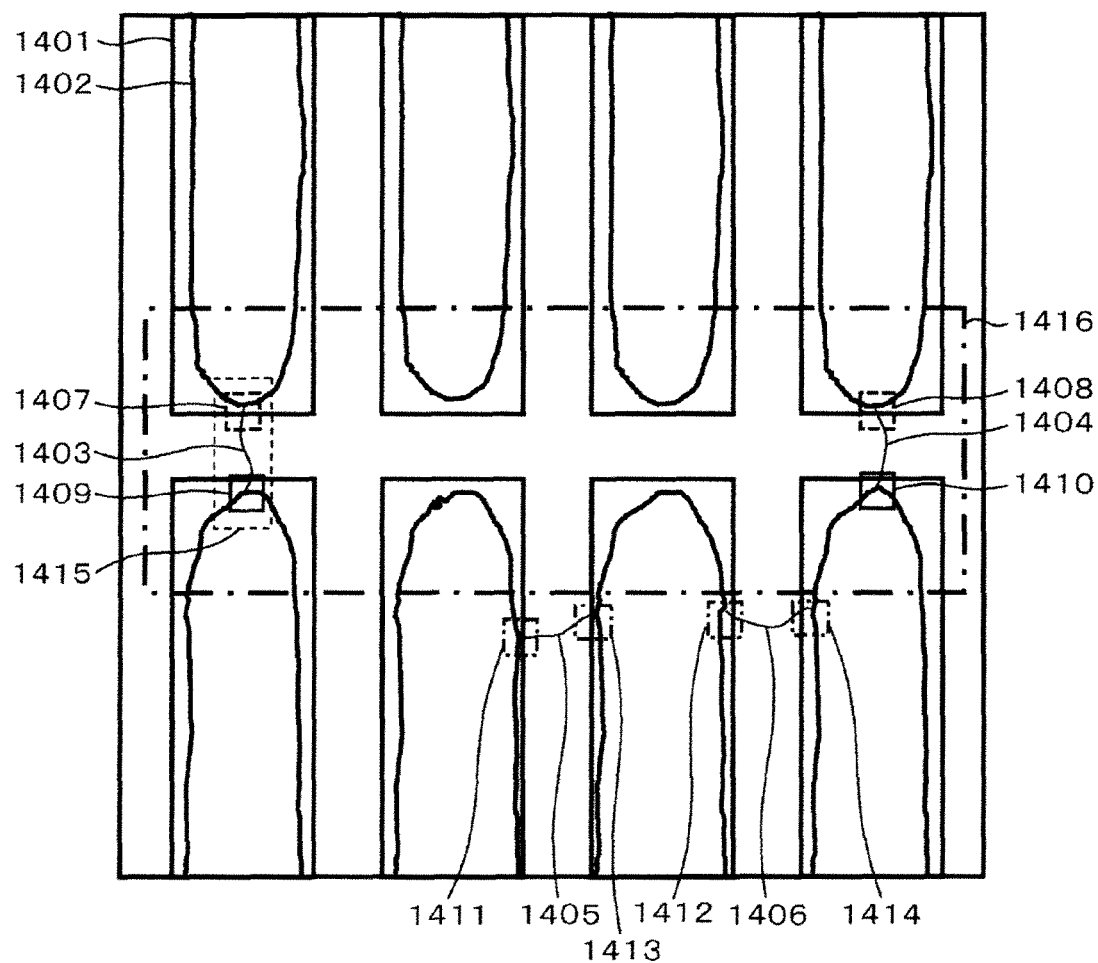
FIG. 14 This is a diagram for explaining an example where the types of the edge branch points are identified by using the templates included in the plurality of libraries.
Figure 15:
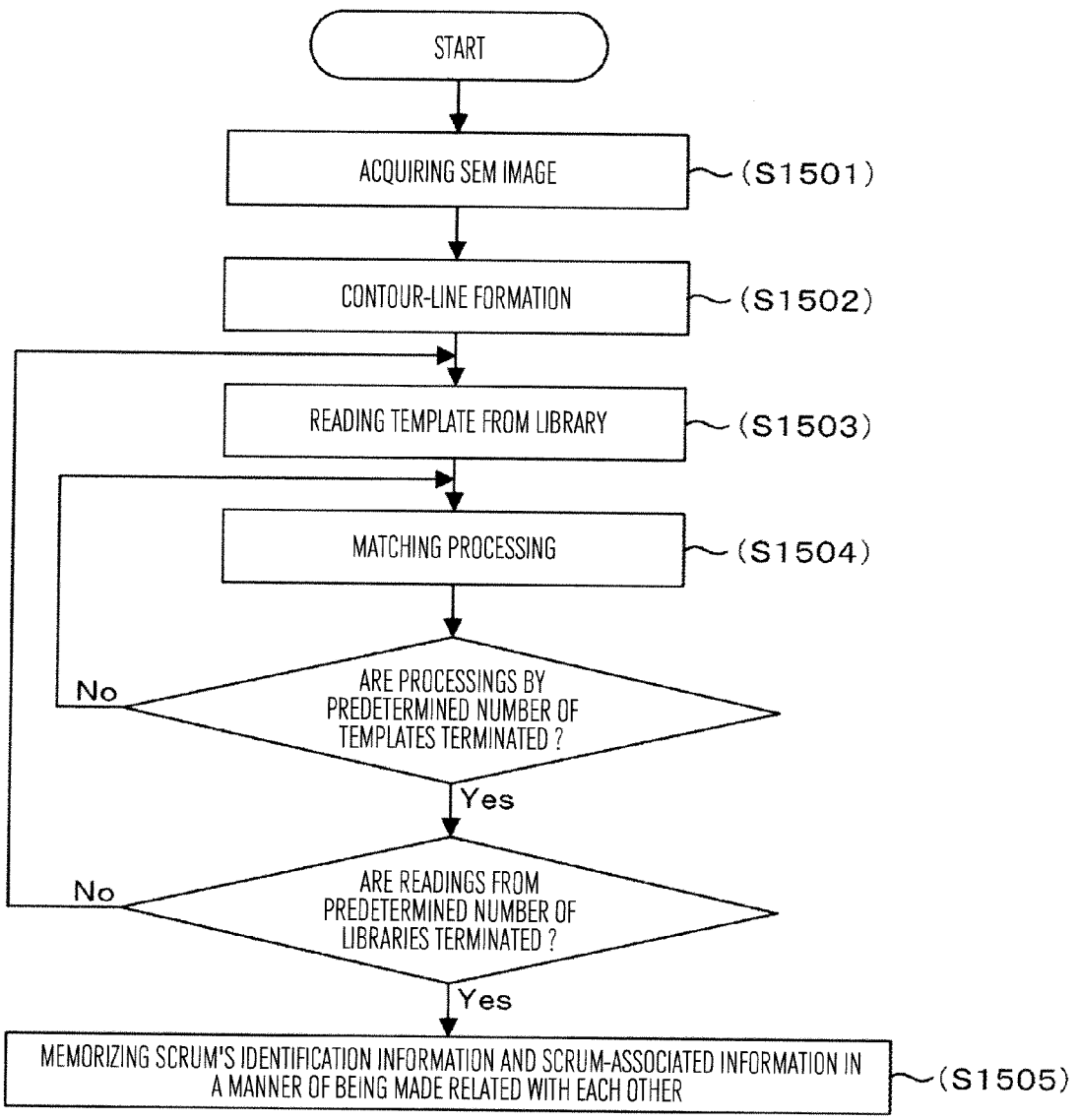
FIG. 15 This is a flowchart for explaining steps of identifying the types of the edge branch points in accompaniment with the detection of the edge branch points.

FIG. 14 is a diagram for explaining an example where the scum detection is performed on the contour-line data on which a plurality of butt-mannered patterns are arranged. Here, the explanation will be given below regarding the example where the classification of the pattern of a scum is performed under a condition that the four types of libraries are prepared. FIG. 15 is a flowchart for explaining the steps of performing the scum detection by utilizing templates that are memorized into the plural types of libraries.

First, the SEM image is acquired (step 1501). Next, based on the relationship such as a correspondence established with the design data 1401, the contour-line data 1402 is created (step 1502). In the example illustrated in FIG. 14, four scums 1403, 1404, 1405, and 1406 are caused to occur. In order to detect these scums, first of all, a template is read from a certain single library (step 1503), then executing the matching processing (step 1504). In this case, if a plurality of templates are included in the single library, the matching is repeated based on the plurality of templates. Moreover, when the matching based on the templates included in the single library is terminated, templates included in the other libraries are read, then executing the matching processing.

FIG. 14 explains the following example: Namely, matching locations 1407 and 1408 are identified by the templates registered in the library A. Matching locations 1409 and 1410 are identified by the templates registered in the library B. Matching locations 1411 and 1412 are identified by the templates registered in the library C. Matching locations 1413 and 1414 are identified by the templates registered in the library D.

Namely, the templates registered in the library A allow the detection of the scums that extend in the downward direction on the drawing. The templates registered in the library B allow the detection of the scums that extend in the upward direction on the drawing. The templates registered in the library C allow the detection of the scums that extend in the rightward direction on the drawing. The templates registered in the library D allow the detection of the scums that extend in the leftward direction on the drawing.

In this way, it becomes possible to judge the pattern of a scum in accordance with the type of the library. The scum identified as described above is then memorized into a predetermined database together with scum-related information (step 1505). Here, the scum-related information are information such as scum's identification information, scum's coordinate information, or information about the library's type-based scum's pattern.

Incidentally, in order to monitor the connection state of a scum, the following step may also be provided, for example: Namely, at this step, a predetermined region 1415 is set in relation with a template. Next, it is judged whether or not another matching location is included within this predetermined region 1415. Then, for example, if a plurality of matching locations exist within this predetermined region 1415, and if a plurality of templates that have identified these plurality of matching locations satisfy a predetermined relationship, it becomes possible to make judgments such that these plurality of matching locations are connected to each other by one and the same scum.

Furthermore, an inspection region 1416 is superimposed on the design data 1401. Moreover, the design data 1401 and the contour-line data 1402 are superposed on each other by the pattern matching or the like. This operation allows the on-design-data-set inspection region to be set at an appropriate position on the contour-line data.

Figures 16, 17:
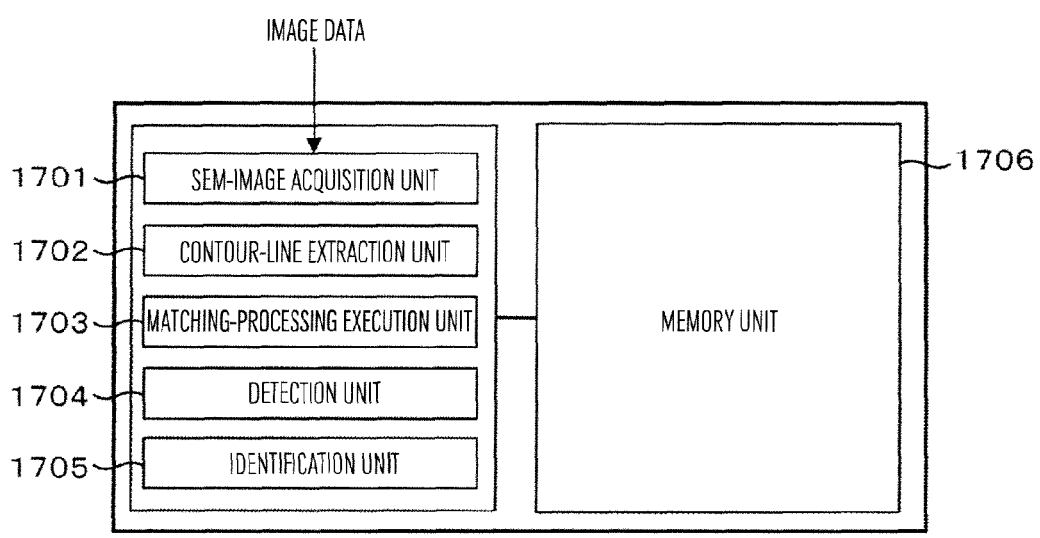
FIG. 16 This is a diagram for explaining the overview of a database for memorizing identification information on scums and information related with the scums in a manner of being made related with each other.
FIG. 17 This is a diagram for explaining the overview of a calculation device for detecting edge branch points.
Figure 23:
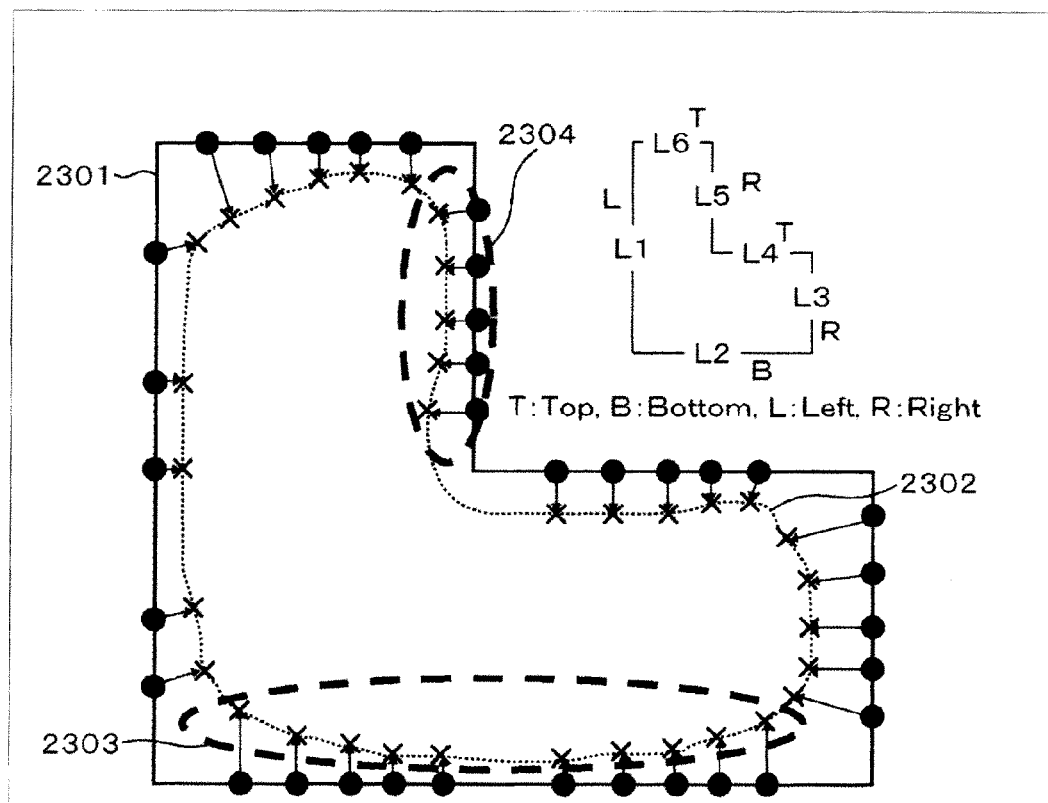
FIG. 23 This is a diagram for explaining an example where identification information on line-segments is added to the line-segments for each line-segment that constitutes contour-line data.

FIG. 16 is a diagram for explaining the overview of the database for memorizing the scum's identification information (: "ID") and the scum-related information in a manner of being made related with each other. The scum's coordinate data (: "Address") registers therein, e.g., the position on the contour-line data and the position information acquired by the matching with the design data. Also, the pattern (: "Pattern") data registers therein information such as identification information on the pattern in which a scum has occurred. Also, the pattern shape (: "Pattern Shape") registers therein information about the type of a library described earlier, and the pattern shape of a scum-has-occurred location acquired based on the design data. The identification information on a pattern line-segment can be acquired in accordance with the following way: Namely, as was exemplified in, e.g., FIG. 12, the identification information on each partial region of the pattern of the design data is beforehand allocated thereto on each partial-region basis. Moreover, the contour-line data's partial region belonging to design data's each partial region is determined by the pattern matching between the design data and the contour-line data, thereby acquiring the identification information on the pattern line-segment. Also, as exemplified in FIG. 23, it is also allowable to add identification information (i.e., line-segment information) to each line-segment of contour-line data 2302 in accordance with the following way: Namely, the matching processing is performed between design data 2301 and the contour-line data 2302. After that, a correspondence relationship is established between each line-segment of the design data 2301 and each line-segment of the contour-line data 2302, thereby adding the line-segment information to each line-segment of the contour-line data 2302. In FIG. 23, reference notations T, B, L, and R denote the upper portion, the lower portion, the left portion, and the right portion, respectively; and each of L1 to L6 denotes the line-segment number. For instance, in the example illustrated in FIG. 23, each line-segment of the contour-line data 2302 included within a region 2303 corresponds to each line-segment of the design data 2301 to which the identification information of "L2" is added. Accordingly, it is conceivable to similarly add the identification information of "L2" to each line-segment of the contour-line data 2302 included within the region 2303. Similarly, each line-segment of the contour-line data 2302 included within a region 2304 corresponds to each line-segment of the design data 2301 to which the identification information of "L5" is added. Accordingly, it is conceivable to similarly add the identification information of "L5" to each line-segment of the contour-line data 2302 included within the region 2304. Of source, it is also allowable to add some other identification information to each line-segment on the basis of a predetermined rule.

It is conceivable to establish the correspondence relationship between each line-segment of the design data 2301 and that of the contour-line data 2302 in accordance with the following way, for example: Namely, a position on the contour-line data 2302 is identified which is the closest to a predetermined position on the design data 2301. Then, this position identified is defined as the correspondence point.

Also, the field of scum's pattern (: "Scum Pattern") registers therein, e.g., the type of a library described earlier, and the identification information on a scum included in a template. Furthermore, the field of "Connect" registers therein the following information: Namely, if a plurality of matching locations are included within the predetermined region 1415 illustrated in FIG. 14, it is judged that these plurality of matching locations are connected to each other by a scum. Then, the information to this effect is registered into the field of "Connect".

These plural pieces of data to be memorized into the database are not necessarily required to be all of the data concerned. Instead, it is just all right to register only the information that is needed for making the scum evaluation as will be described later.

FIG. 17 is a diagram for explaining the overview of a calculation device for detecting edge branch points. The calculation device includes therein the following configuration components: Namely, a SEM-image acquisition unit 1701 for acquiring image data from the circuit pattern 401 or the like, a contour-line extraction unit 1702 for extracting the contour-line information from the image data, a matching-processing execution unit 1703 for executing the pattern matching by using a predetermined template, a detection unit 1704 for detecting edge branch points that are identified by the pattern matching, an identification unit 1705 for identifying the detected edge branch points on the basis of a predetermined condition, and a memory unit 1706 for memorizing information needed for processing inside the calculation device. The identification unit 1705 identifies and memorizes, on a table format as exemplified in FIG. 16, the above-described information for allowing the identification from other scum portions. Otherwise, the identification unit 1705 adds information about the number of scums within the contour-line data. Here, the above-described information are such information as the identification information (: ID), the coordinate data (: Address), the section information on the pattern in which a scum has occurred, and the type of a library which memorizes a template that has identified an edge branch point. Also, it is allowable to memorize the information into data folders that are prepared on each scum's pattern basis, and in a manner of being classified in accordance with each scum's pattern.

Incidentally, the example illustrated in FIG. 17 is configured as follows: Namely, a storage medium is built in the calculation device. Moreover, the calculation units are so configured as to become accessible to the memory unit, depending on the requirements. It is also allowable, however, that the storage medium is set up outside the calculation device, and that the calculation device is so configured as to access the memory unit, depending on the requirements.

Figure 19:
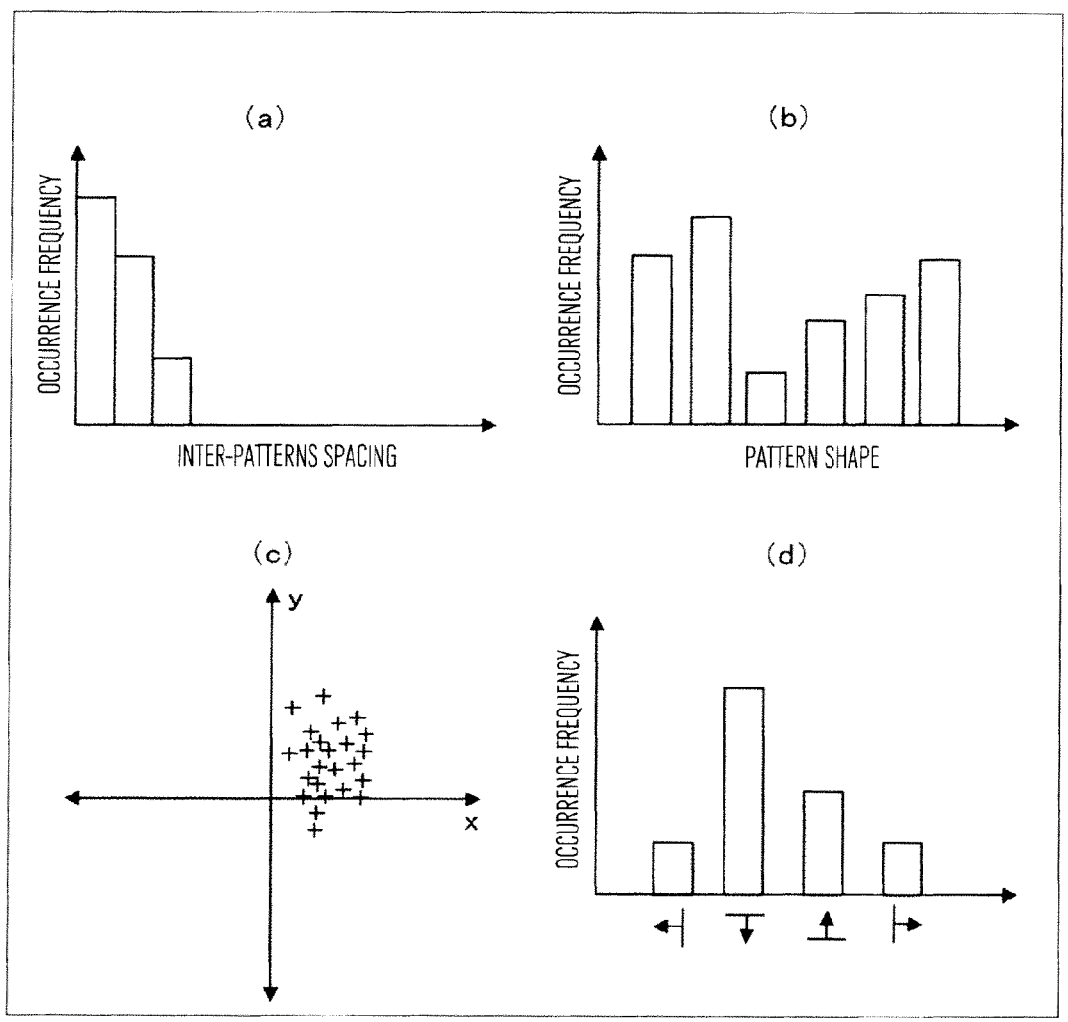
FIG. 19 These are diagrams for explaining outputted examples of statistical values of the scum-detection result.

FIG. 19 illustrates diagrams for explaining outputted examples of statistical values of the scum-detection result. For example, the diagram (a) in FIG. 19 illustrates a graph where the transverse axis indicates the intervals between patterns, and where the longitudinal axis indicates the scum's occurrence frequency. The inter-patterns intervals information may be acquired from the design data, or may be acquired from actual measurement values as will be described later. Displaying a graph like this makes it possible to judge to what extent the inter-patterns intervals will make contribution to the scum's occurrence.

The diagram (b) in FIG. 19 exemplifies a graph where the transverse axis indicates the pattern shape, and where the longitudinal axis indicates the scum's occurrence frequency. Displaying a graph like this makes it possible to evaluate the connection between the scum's occurrence and the pattern shape. Here, factors that are mentionable as the pattern shape are, e.g., a line's end section, line's corner section, and line's straight-line section. Also, factors that are allowable as well are composite conditions of a plurality of patterns (e.g., the butt-mannered pattern, the section at which a line's end section and a line's corner section are proximate to each other, and the section at which a line's straight-line section and a line's end section are proximate to each other). Moreover, it is also allowable to perform the identification display by dividing the bar graph in accordance with the inter-patterns distances. This display is performed in order to display the per-inter-patterns-distance occurrence frequency on each pattern-shape basis.

The diagram (c) in FIG. 19 is a distribution graph of the occurrence frequency on each pattern's direction basis. The present example's case performs the distribution display of the scum's occurrence direction and the scum's length. Displaying a distribution diagram like this makes it possible to confirm the relationship between the scum's occurrence direction and the scum's length. Incidentally, replacing the inter-scums distances by the inter-patterns dimensions makes it possible to grasp the relationship between the inter-patterns intervals and the scum's occurrence. The information about the scum's occurrence direction is extracted based on the judgment as to at which position of the pattern there exists a scum that has occurred thereon.

The diagram (d) in FIG. 19 is a distribution graph for illustrating the relationship between scums and lengths of the scums. Here, the scums are identified by using templates which allow the identification of occurrence directions of the scums (and which were explained in FIG. 13 and the like). Taking advantage of a plurality of templates which allow the identification of four occurrence directions of the scums, the present example's case identifies the four occurrence directions, thereby pointing out the occurrence frequencies in the respective occurrence directions. The present example's case allows the following judgment to be made: Namely, comparatively speaking, the scums that extend in the up and down directions are caused to occur frequently.

Figure 20:
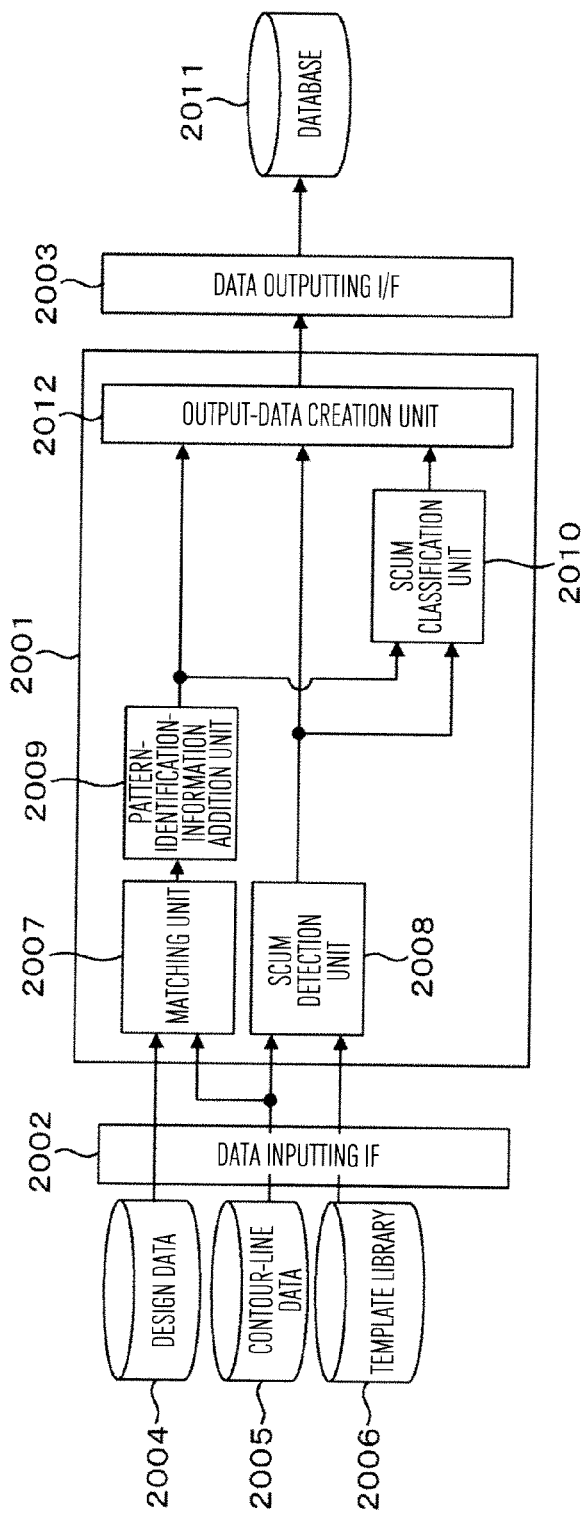
FIG. 20 This is a diagram for explaining the overview of an image processing apparatus.

FIG. 20 is a block diagram for explaining the overview of an image processing apparatus 2001. The image processing apparatus 2001 includes the following configuration components: Namely, a data inputting interface 2002 for inputting data from design data 2004, contour-line data 2005, and a template library 2006, a matching unit 2007 for performing the matching between the design data 2004 and the contour-line data 2005, and a pattern-identification-information addition unit 2009 for adding pattern's identification information and pattern's each section's identification information on the basis of the matching. The pattern-identification-information addition unit 2009 performs the operation of adding, to the contour-line data 2005, the pattern's identification information and pattern's each section's identification information contained in the design data 2004.

A scum detection unit 2008 executes the scum detection on the contour-line data 2005, using the templates for detecting edge branch points stored in the template library 2006. The scums that are detected in this way are classified by a scum classification unit 2010 on the basis of the identification information added by the pattern-identification-information addition unit 2009, and/or the identification information included in the templates memorized in the template library 2006. The scum-related information, the design data, and the contour-line data are then converted into a predetermined data format by an output-data creation unit 2012, then being memorized into a database 2011 via a data outputting interface 2003.

Figure 18:
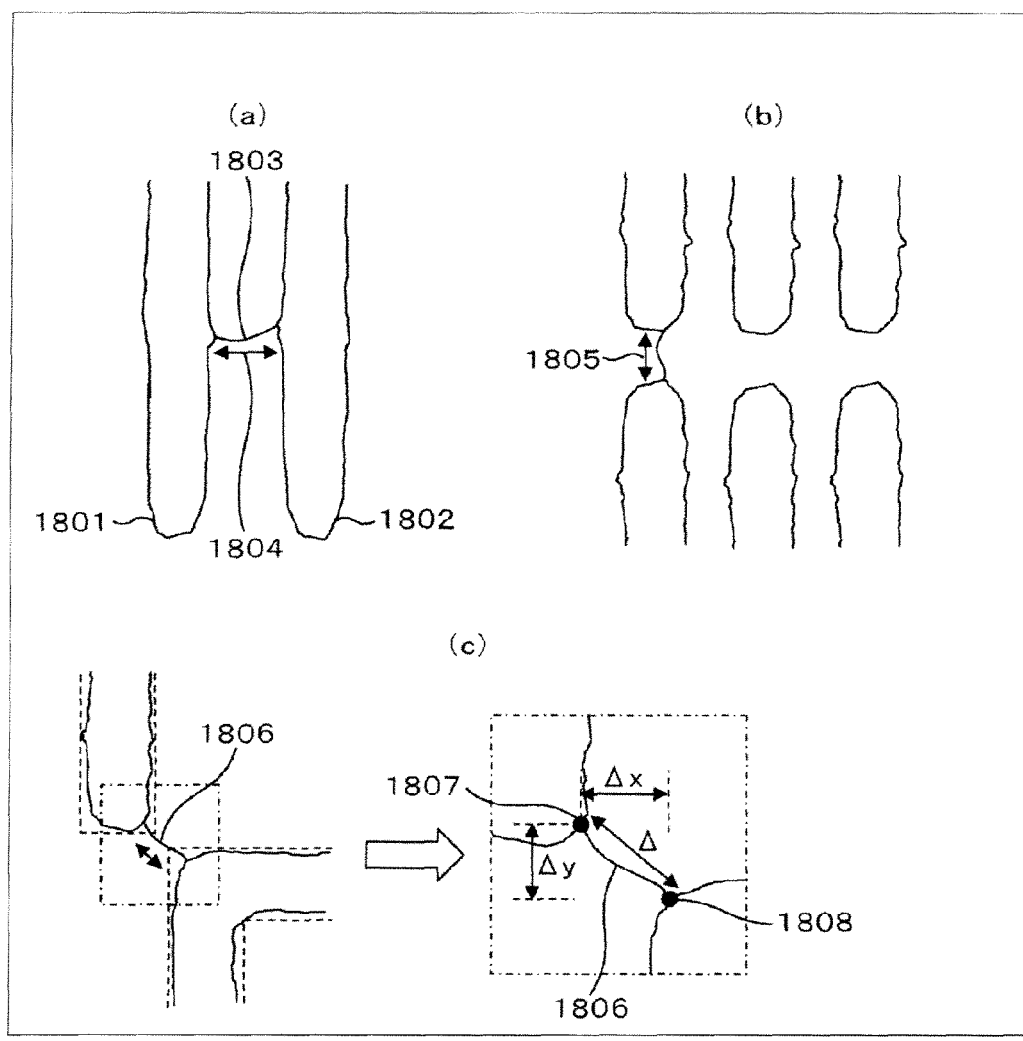
FIG. 18 These are diagrams for explaining examples where the dimension between edge branch points is measured based on the detection of the edge branch points.

FIG. 18 illustrates diagrams for explaining examples where the dimension between edge branch points is measured based on the detection of a scum associated therewith. The diagram (a) in FIG. 18 explains an example where a scum is caused to occur between a plurality of line patterns. Namely, in the diagram (a) in FIG. 18, a scum 1803 is caused to occur between a first contour line 1801 and a second contour line 1802. In general, two edge branch points exist at the end portions of the scum 1803 like this. Then, a length-measurement location 1804 is set with these two edge branch points selected as the length-measurement start point and the length-measurement end point. The setting for the length-measurement location 1804 like this allows the scum-has-occurred location to be selectively set as the evaluation target. Accordingly, when the scum is defined as a defect, the edge-branch-points' extraction-based selection of the measurement start point and the measurement end point results in a situation that the defect-equivalent portion is selected as the measurement target. As a result, it becomes possible to implement the improved efficiency and automation of creation of the measurement recipe.

The diagram (b) in FIG. 18 explains an example where a scum is caused to occur between line's end sections. Namely, in the present example, a length-measurement location 1805 is selectively set at the scum-has-occurred location. In this way, the scum-has-occurred location is selectively set as the measurement target. This method allows execution of the high-efficiency length measurement.

The diagram (c) in FIG. 18 explains an example where a scum 1806 is caused to occur between a line's end section and the corner (outer-corner) section of a pattern. In the present example, a first edge branch point 1807 and a second edge branch point 1808 are set as the length-measurement start point and the length-measurement end point, respectively. Incidentally, factors that are settable as the measurement target are as follows: The inter-two-edge-branch-points' X-direction interval (: Δx), Y-direction interval (: Δy), two-dimensional-direction interval (: A); or the length of the scum 1806 itself.

Figure 22:
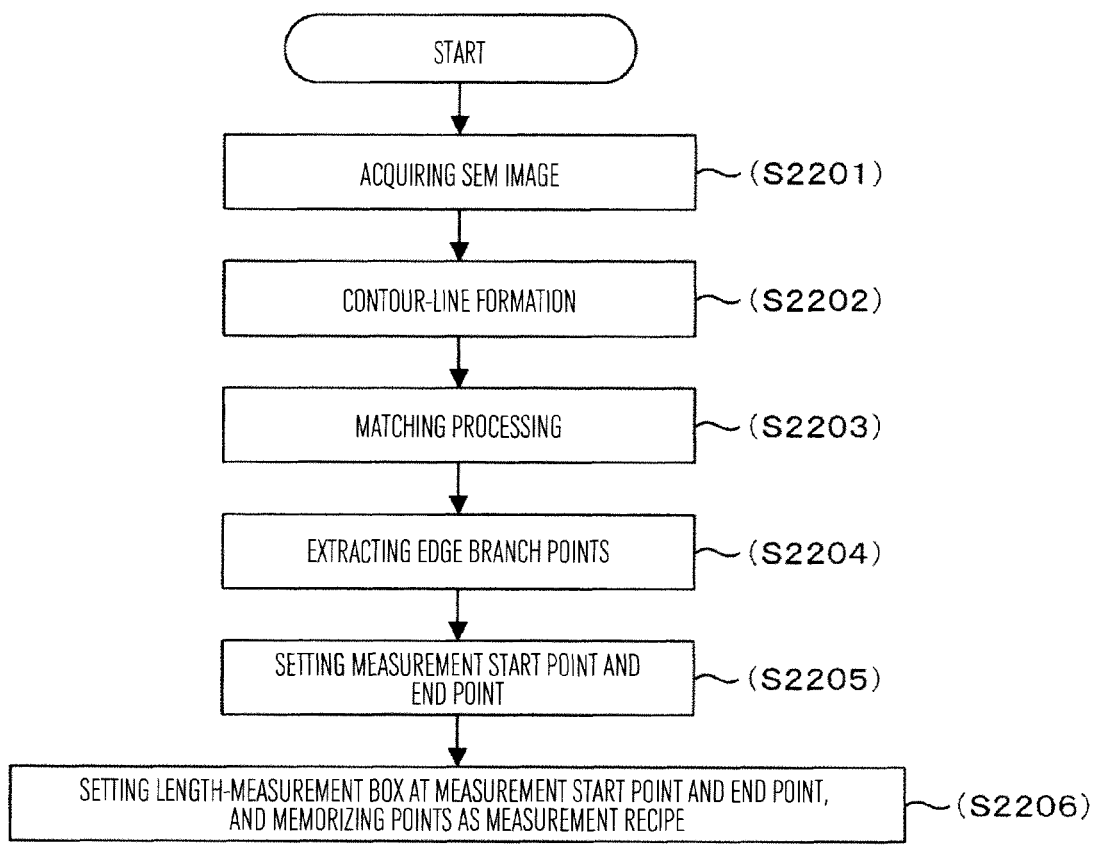
FIG. 22 This is a flowchart for explaining steps of automatically setting a measurement location on the basis of the detection of edge branch points.

FIG. 22 is a flowchart for explaining steps of automatically setting a measurement location on the basis of the detection of edge branch points associated therewith. Steps 2201 to 2204 are basically the same as the detection steps of detecting the edge branch points. A step 2205 is a processing step of setting the measurement location from the detected edge branch points. At this time, the above-described pattern section's classification information is utilized for setting, as the measurement target, the inter-edge-branch-points' interval associated with the measurement location.

Figure 21:
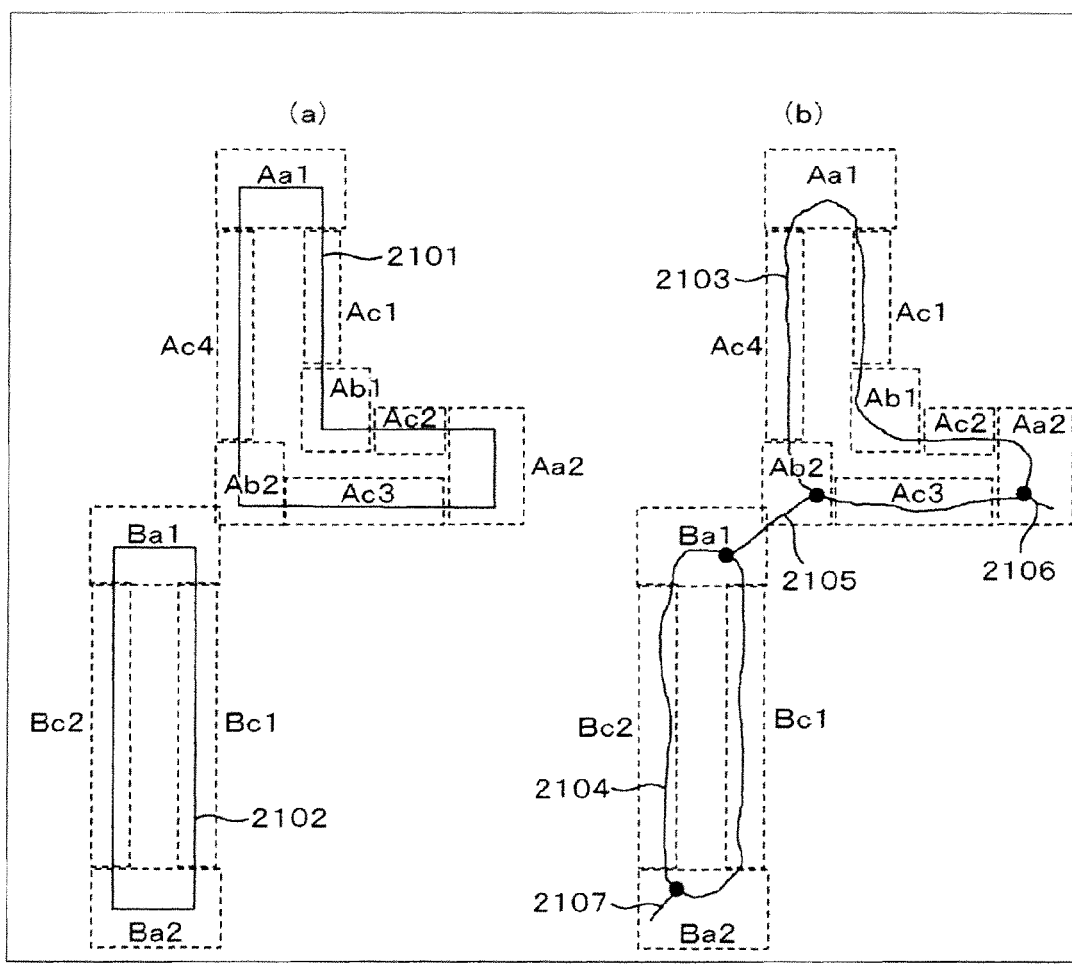
FIG. 21 These are diagrams for explaining a technique whereby identification information on each pattern's section is added to contour lines.

FIG. 21 illustrates diagrams for explaining a technique of adding pattern section's identification information to contour-line data 2103 and 2104. The diagram (a) in FIG. 21 exemplifies L-character-shaped pattern's design data 2101 and line pattern's design data 2102. The pattern section's identification information for identifying each pattern section are added to the design data 2101 and the design data 2102. In the case of the present example, for instance, "A" of "Aa1" is an identification notation for identifying each pattern, "a" of "Aa1" is an identification notation for identifying the type of each pattern section, and "1" of "Aa1" is an identification notation that is attached to each of a plurality of same-type pattern sections when these pattern sections exist. In the case of the present example, concretely speaking, "A" denotes the L-character-shaped pattern, and "B" denotes the line pattern. Also, "a", "b", and "c" denote a line's end section, line's corner section, and line's straight-line section, respectively.

The diagram (b) in FIG. 21 exemplifies the following state: Namely, in this state, the above-described pattern section's identification information is added to the contour-line data 2103 and 2104. This addition is made possible by executing the pattern matching between the design data, to which the pattern section's identification information are added, and the contour-line data 2103 and 2104. The addition of the identification information to the contour lines belonging to each identification region results in a situation that the contour lines are equipped with the information that are unique for each section.

Now, based on the pattern section's identification information like this, consideration is given to a combination of pattern sections (e.g., a region "Ab2" of the contour-line data 2103, and a region "Ba1" of the contour-line data 2104 in the case of the present example) over which it is conceivable that the edges will be connected to each other by scums. Then, if edge branch points are formed in both of these pattern sections, both of the edge branch points are respectively set as the measurement start point and the measurement end point. The setting makes it possible to automatically select the scums-will-occur locations as the measurement target.

Meanwhile, it is conceivable from the distance's point-of-view that a scum 2107 belonging to a region "Ba2" will never become a continuous scum in accompaniment with the scum belonging to the region "Ab2". Accordingly, if the scums should occur in both of the regions "Ab2" and "Ba2", the interval therebetween is excluded from the measurement target. Also, if a scum 2106 should occur in a region "Aa2", and also if the scum should occur in the region "Ba1", the circumstances are basically the same. Consequently, the interval therebetween is excluded from the measurement target.

As described above, the following processing is executed: Namely, in a case where scums occur in both of a combination of regions that are proximate to each other (i.e., "Ab2" and "Ba1" in the case of the present example), both of these regions are selectively set as the measurement-target locations. Otherwise, both of these regions are excluded from the measurement target. Based on the execution of this processing, the portion, in which it looks like that circuit patterns are connected to each other by scums, can be selectively set as the measurement target.

At the step 2205 illustrated in FIG. 22, the length-measurement start point and end point are set based on the rules as described above. Finally, these points set are memorized as the measurement recipe (step 2206).

Next, the explanation will be given below concerning a scum-detecting technique where information about the cross-section shape of a pattern is determined from the image data, and is used.

Figure 25:
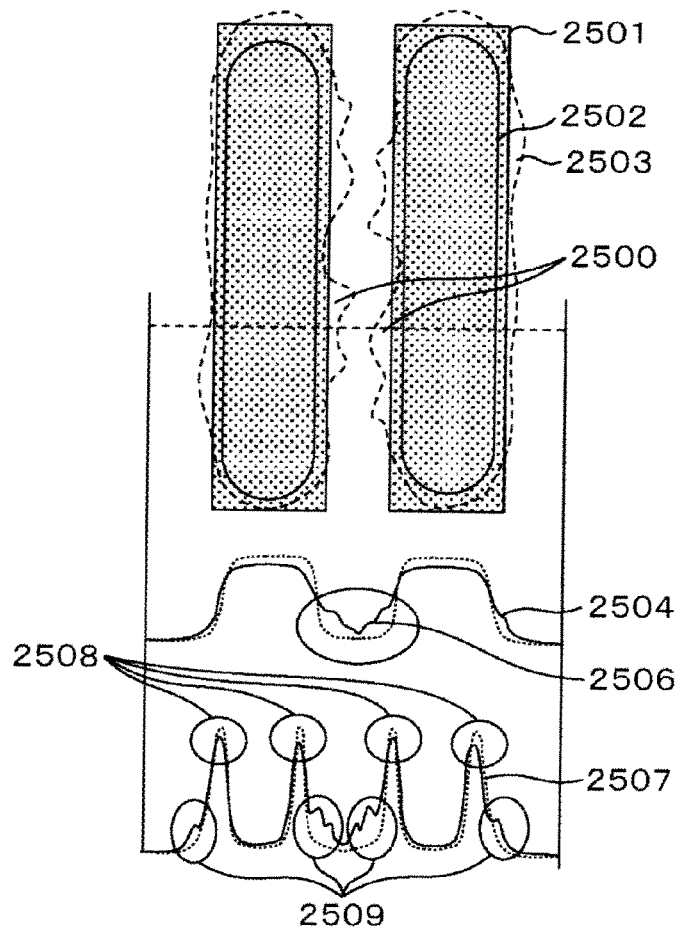
FIG. 25 This is a diagram for explaining the cross-section profile and image profile of a pattern.

FIG. 25 is a diagram for illustrating the scum detection where profile edges are used. Concretely speaking, FIG. 25 is the diagram where the following pieces of data are superimposed on each other: Namely, each line pattern in which a scum 2500 exists at the lower portion 2503 (which, hereinafter, will be referred to as "the pattern-edge lower portion 2503") of the pattern edge, the cross-section shape 2504 (hereinafter, referred to as "the cross-section profile 2504") of each line pattern, the luminance profile 2507 (hereinafter, referred to as "the image profile 2507") of each line pattern's image data corresponding to the cross-section, and design data 2501 based on the pattern-matching result.

In addition to the line-like scum illustrated in FIG. 3, a scum 2506 that exists at the pattern-edge lower portion like this becomes the cause for a fatal and critical defect. Accordingly, its detection is also necessary.

Incidentally, for your information, the illustration is given to the profiles in the case where the scum is present, and the profiles in a case where the scum is absent. The dashed lines indicate the profiles of the scum-absent pattern, and the solid lines indicate the profiles of the scum-present pattern.

In order to detect the scum 2506 that exists at the pattern-edge lower portion 2503, the following scum-detecting method is executed: Namely, an image signal 2508 (hereinafter, referred to as "the top edge 2508") that is equivalent to the upper portion 2502 (hereinafter, referred to as "the pattern-edge upper portion 2502") of the pattern edge, and an image signal 2509 (hereinafter, referred to as "the under edge 2509") that is equivalent to the pattern-edge lower portion 2503 are individually extracted by analyzing the image profile 2507. Next, contour data that is constituted from the top edge 2508, and contour data that is constituted from the under edge 2509 are created, respectively. Moreover, the presence or absence of the scum is detected by making the shape comparison between these pieces of contour data. If the scum is actually present in the pattern, a significant shape difference is caused to occur between the contour data constituted from the top edge, and the contour data constituted from the under edge. Consequently, the pattern that gives rise to the occurrence of this significant shape difference is detected as the scum-present pattern.

Hereinafter, referring to FIG. 26 and FIG. 27, the concrete explanation will be given below regarding the scum-detecting method where the profile edges are used.

Figure 26:
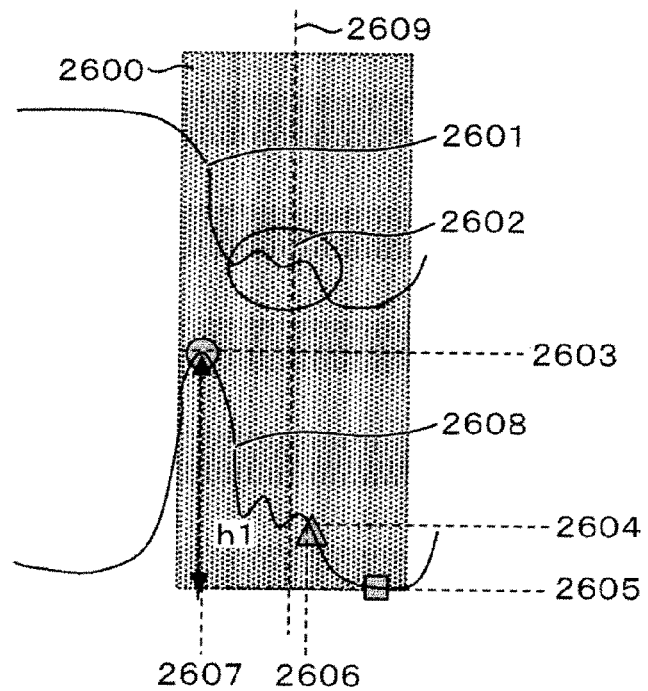
FIG. 26 This is a diagram for explaining a method of detecting edges by analyzing the image profile.

FIG. 26 illustrates the cross-section profile 2601 of a partial line pattern, and its image profile 2608.

A pattern region 2600 indicates the groove region of a line pattern where a scum is caused to occur. The pattern region 2600 is specified by the user as the area information about the scum-detection executing area. Also, the groove region 2600 may be set based on the result of the pattern matching between the groove portion/non-groove portion' information-equipped design data, and the image data.

First, a peak signal 2603 of the image profile 2608 is determined which exists in proximity to the boundary of the groove region 2600. Then, its peak position 2607 is determined. This point 2607 is defined as the position of the top edge equivalent to the pattern-edge upper portion.

Next, a bottom-peak signal 2605 of the image profile 2608 is detected which exists in a direction heading for the center 2609 of the groove region 2600 from the peak position 2607.

Next, a signal difference h1 between the peak signal 2603 and the bottom-peak signal 2605 is calculated. Next, a point 2606 of the image profile 2608 is determined which is equivalent to a threshold value 2604. Here, this threshold value 2604 is further equivalent to a signal value (e.g., the bottom-peak signal+h1×0.2) that falls into a range of the bottom-peak signal 2605 to the peak signal 2603. This point 2606 is defined as the position of the under edge equivalent to the pattern-edge lower portion.

The above-described detection of the top edge and the under edge is performed over an image region of the scum detection target. Incidentally, the reference direction of the image profile for performing the edge detection may be specified by the operator for each of the points at which the edge points are to be detected. Otherwise, this reference direction can be set based on a continuous direction of the design data used for the pattern matching.

Next, the edge points detected are connected to each other, thereby creating the top edge's contour data (hereinafter, referred to as "the upper-portion contour data"), and the under edge's contour data (hereinafter, referred to as "the lower-portion contour data").

Figure 27:
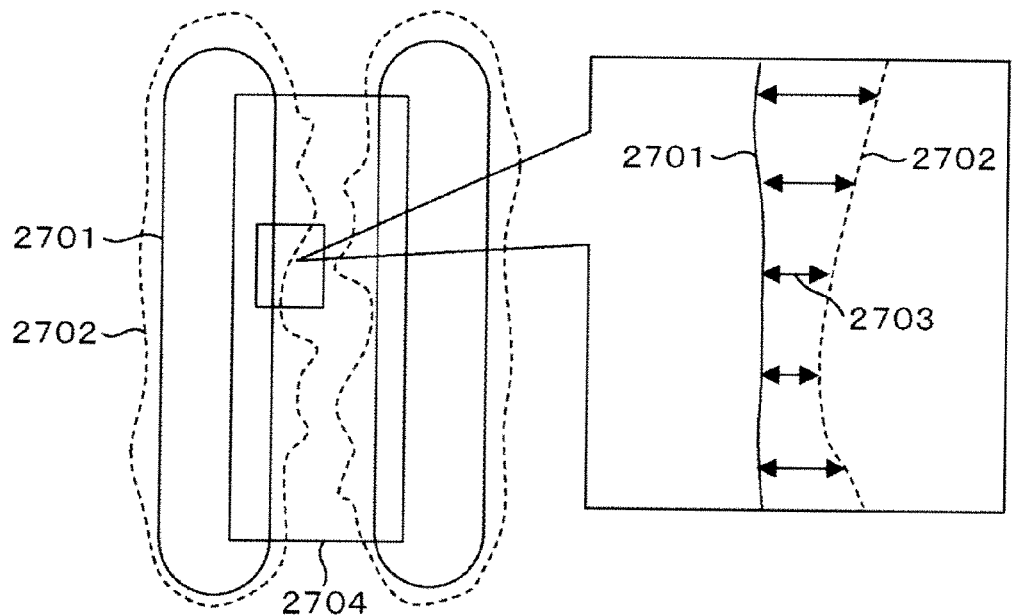
FIG. 27 This is a diagram for explaining a detection method of detecting scums.

FIG. 27 illustrates examples of the upper-portion contour data 2701 and the lower-portion contour data 2702.

Next, a plurality of intervals (i.e., errors) 2703 between the upper-portion contour data 2701 and the lower-portion contour data 2702 are measured all-inclusively within a target region 2704 of the scum detection. It is assumed here that the interval of this measurement can be set arbitrarily.

Next, the statistical value of the plurality of error values measured in this way is calculated, then being defined and used as an indicator for judging the presence or absence of a scum. For example, the average value or maximum value of the error measurement values indicates a separation gap between the edge positions at the pattern's upper and lower portions. Accordingly, it can be regarded that, the larger the average value is, the higher the scum-occurring-and-existing possibility is. Also, if the scum actually exists, the edge shape at the pattern's lower portion is significantly distorted as is illustrated in FIG. 27. The extent of this distortion can be expressed by the variance or standard deviation of the error measurement values. Namely, it can be regarded that, the larger the error measurement values' standard deviation is, the higher the scum-occurring-and-existing possibility is.

Finally, a threshold-value processing is applied to the scum-judging indicator based on the statistical value of the error values between the upper-portion contour data and the lower-portion contour data. Then, the pattern that results in implementation of the indicator whose value is larger than the threshold value is detected as the scum-existing pattern.

Also, if the extent of the distance-wise separation gap between the upper-portion contour data and the lower-portion contour data, or the extent of the variation associated therewith exceeds a predetermined value, the scum detection may be selectively made for the portion corresponding thereto. Otherwise, if, after the scum detection is carried out, the extent of the variation or the like is found to be smaller than the predetermined value, a filtering for the scum-detection result may also be performed. This filtering is performed considering that the detected scum is not a scum (e.g., there is a possibility that a noise or the like is detected).

Furthermore, the information about the separation gap or the variation, and the scum-detection result are memorized into a database, as is exemplified in FIG. 16, in a manner of being made related with each other. The execution of this related memory allows identification of the cause-and-effect relationship between the extent of the inter-contour-lines separation gap, and the occurrence of the scums.

Next, the explanation will be given below concerning a scum-detecting technique where a variation in the image signal of a pattern is utilized. As illustrated in FIG. 26, a change in the image signal of a pattern's groove portion where a scum is present is more significant as compared with a change in the image signal of the pattern's groove portion where a scum is absent. This condition makes it possible to identify the pattern's groove portion, thereby allowing the calculation of a variation in the image signal of this identified region by using the variance, standard deviation, or the like. As a result, it becomes possible to judge the presence or absence of the scum from its magnitude.

Figure 28:
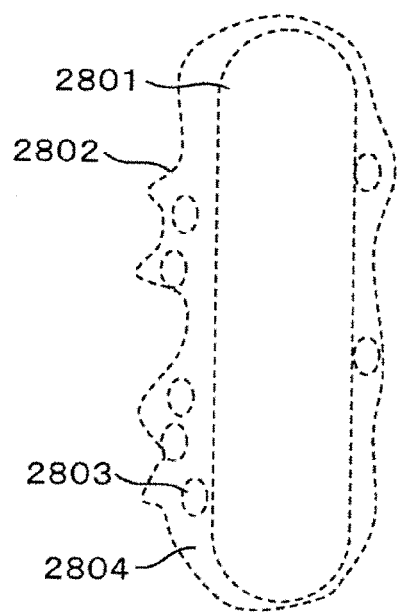
FIG. 28 This is a diagram for explaining an example where the scum detection is performed by using two pieces of contour-line data.

Hereinafter, the concrete explanation will be given below regarding the scum-detecting processing steps. In the scum detection where the luminance distribution is utilized, FIG. 28 illustrates upper-portion contour data 2801 and lower-portion contour data 2802 about the pattern edge of a scum-existing line pattern. Scums 2803 are caused to occur within a region surrounded by the pattern edge's upper-portion contour data 2801 and the pattern edge's lower-portion contour data 2802. In view of this situation, an evaluation area 2804 for evaluating the scums is limited using the pattern edge's upper-portion and pattern edge's lower-portion contour data 2801 and 2802, which are determined by the pattern edge's detection explained using FIG. 26.

Incidentally, the evaluation area 2804 can be limited using either of the pattern edge's lower-portion contour data and the pattern edge's inner-portion contour data. Otherwise, the evaluation area 2804 may also be set by the operator. Moreover, the evaluation area 2804 may also be limited based on the result of the pattern matching between the groove portion/non-groove portion' information-equipped design data (or simulation data), and the image data.

Next, the statistical value for indicating a variation in the image signal is calculated. Here, the statistical value is such a value as the variance or standard deviation of the image data included within the evaluation area 2804. Finally, a threshold-value processing is applied to the statistical value for indicating the variation in the image signal. Then, the pattern that results in implementation of the statistical value which is larger than the threshold value is detected as the scum-existing pattern.

Also, if the extent of the data about the variation in the image signal exceeds a predetermined value, the scum detection may be selectively made for the portion corresponding thereto. Otherwise, if, after the scum detection is carried out, the extent of the variation or the like is found to be smaller than the predetermined value, a filtering for the scum-detection result may also be performed. This filtering is performed considering that the detected scum is not a scum (e.g., there is a possibility that a noise or the like is detected).

Furthermore, the information about the variation in the image signal, and the scum-detection result are memorized into a database, as is exemplified in FIG. 16, in a manner of being made related with each other. The execution of this related memory allows identification of the cause-and-effect relationship between the extent of the inter-contour-lines separation gap, and the occurrence of the scums.

Figure 36:
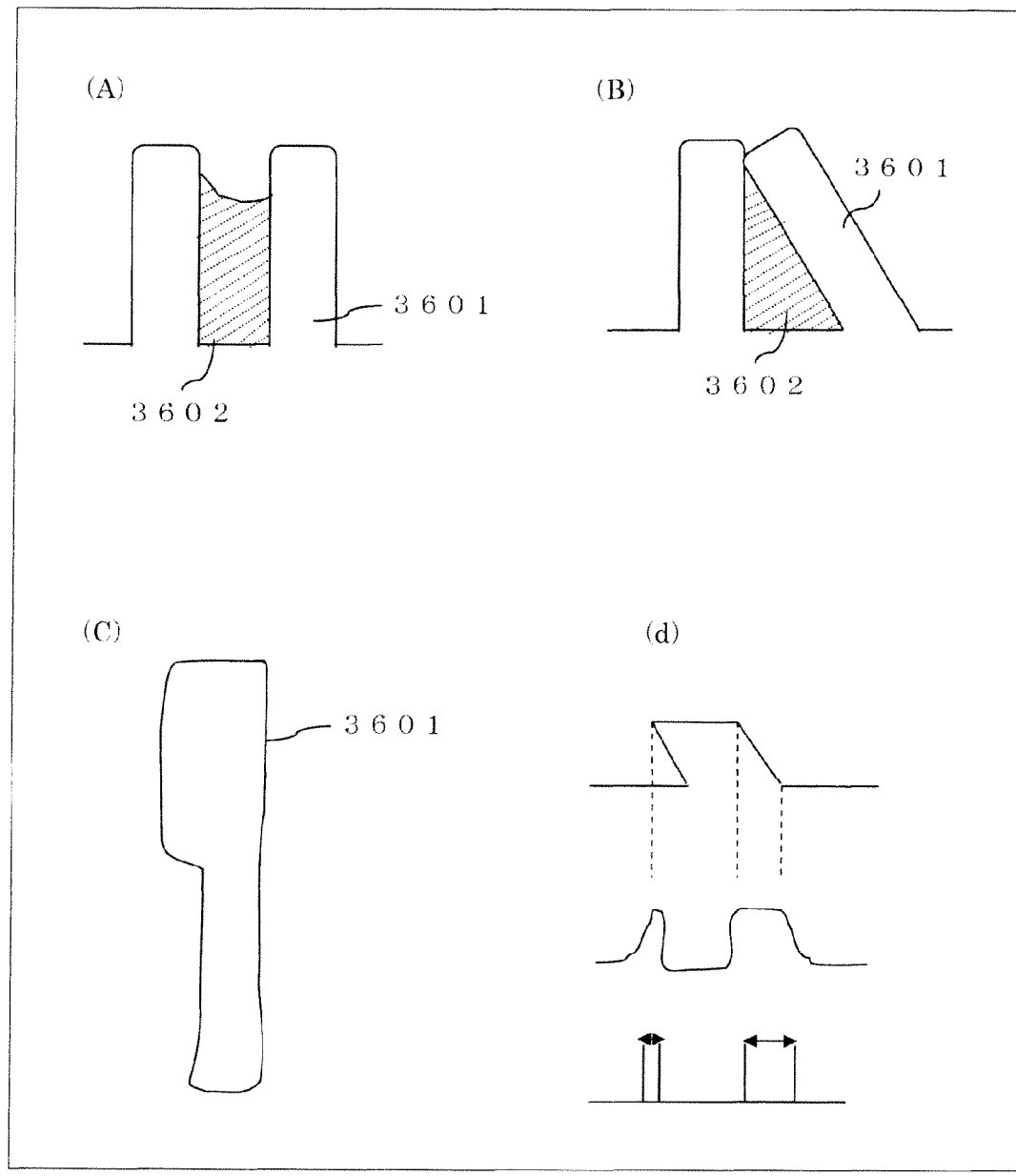
FIG. 36 This is a diagram for explaining an example of the falling of a pattern.
Figure 37:
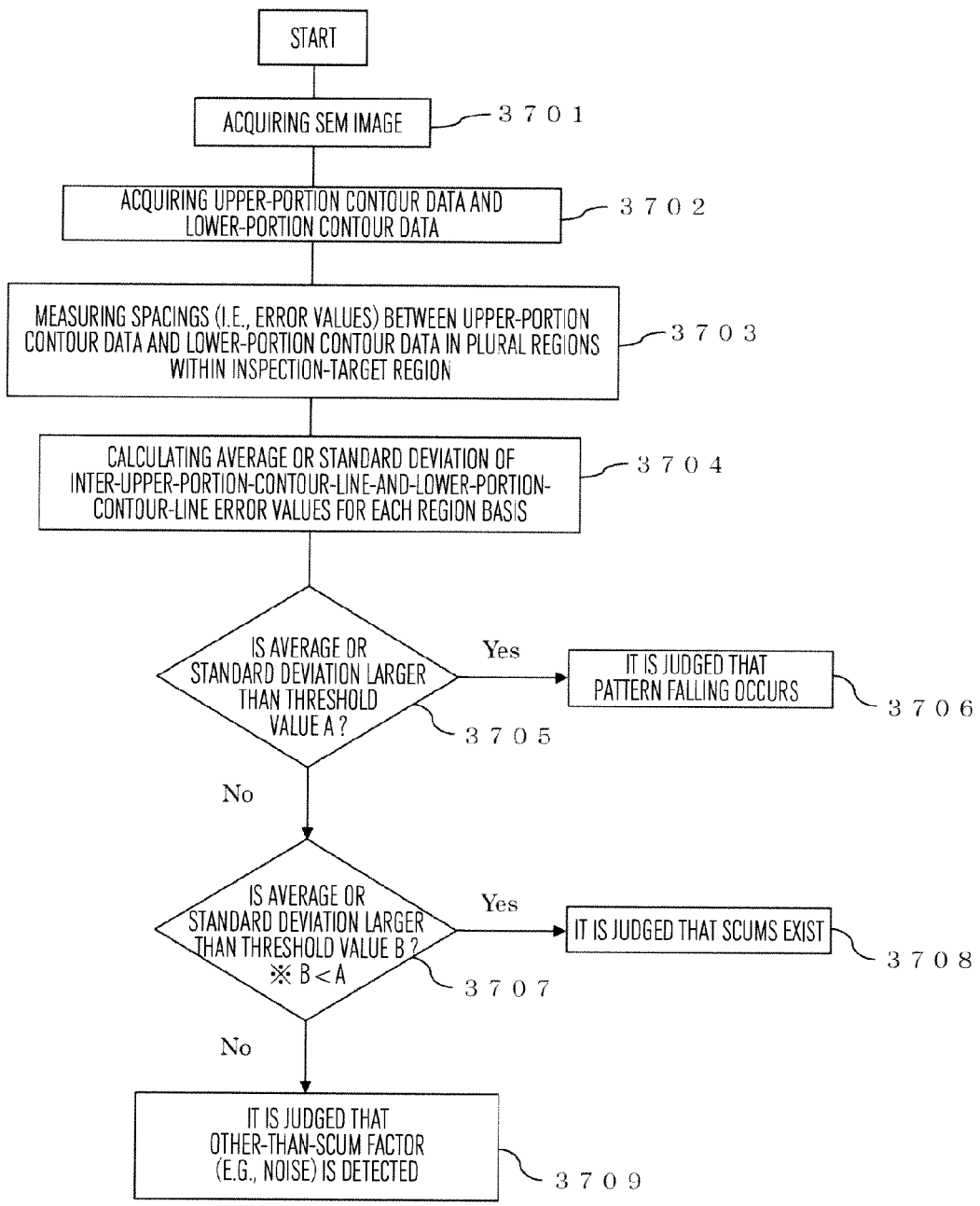
FIG. 37 This is a flowchart for explaining steps of judging the falling of a pattern after the pattern data is formed into a contour line.

Next, the explanation will be given below concerning the following example: Namely, in this example, the detection of a pattern falling is performed based on the statistical value of the plurality of intervals (i.e., errors) 2703 between the upper-portion contour data 2701 and the lower-portion contour data 2702 within the above-described scum-detection target region 2704. A pattern falling is caused to occur by a pattern's washing step using rinse liquid, or a pattern's drying step in the pattern-forming process. A diagram (a) in FIG. 36 illustrates a manner in which patterns are normally arranged; whereas a diagram (b) in FIG. 36 illustrates a manner in which a pattern falling occurs. As illustrated in (b) in FIG. 36, the pattern falling is sometimes caused to occur by a mutually-pulling force (i.e., surface tension) that is exerted between two patterns by the use of the washing liquid or the like. Also, a diagram (c) in FIG. 36 illustrates a pattern's manner seen from the above in which a local pattern falling occurs at the pattern's upper portion. In a pattern having a certain extent of length, only a partial region of the pattern is sometimes twisted, or falls. By the way, if a pattern falling occurs, the following situation is assumed: Namely, depending on the inclination angle of a pattern caused by this pattern falling, the plurality of error values between the upper-portion contour data 2701 and the lower-portion contour data 2702, and also variations in the error values become larger than the error values and variations caused by the existence of scums. In view of this situation, referring to FIG. 37, the explanation will be given below regarding an example of the following judgment processing steps: Namely, based on the error values between the upper-portion contour data and the lower-portion contour data, it is judged whether a pattern falling occurs, or scums exist. If a clear distinction can be made between these two situations, an individual proper countermeasure against each of them can be taken. Namely, for example, against the occurrence of a pattern falling, reselection of the rinse liquid, or feedback to the pattern's design is performed. First, the SEM image is acquired using the SEM 201 (step 3701). After that, the pattern's upper-portion contour data 2701 and the pattern's lower-portion contour data 2702 are acquired, respectively (step 3702). Next, the plurality of intervals (i.e., error values) 2703 between the upper-portion contour data 2701 and the lower-portion contour data 2702 are measured all-inclusively for a plurality of regions within the scum-detection target region 2704 along the pattern's edge (step 3703). Moreover, the average value or standard deviation of the error values measured for each of the regions is calculated (step 3704). The value determined here may be either of the average value and the standard deviation. Otherwise, both of them may be calculated to be used as evaluation targets at the following steps. Next, it is judged whether or not the value of the average value or standard deviation calculated is larger than a predetermined threshold value A that is determined in advance (step 3705). Then, if the value is larger than the threshold value A, it is judged that a pattern falling occurs (step 3706). Meanwhile, if the value is smaller than the threshold value A, it is judged further whether or not the value is larger than a predetermined threshold value B (B<A) that is determined in advance (step 3707). Then, if the value is larger than the threshold value B, it is judged that scums exist (step 3708). Meanwhile, if the value is smaller than the threshold value B, it is judged that the cause is the detection of a factor other than the scums (, such as, e.g., a noise) (step 3709). In this way, if the plurality of intervals (i.e., error values) between the upper-portion contour data 2701 and the lower-portion contour data 2702 possess their magnitudes and variations of a certain extent, the judgments where the threshold values are used are made. This judgment method makes it possible to judge whether the cause for the possession of the magnitudes and variations is due to the occurrence of scums, or due to another factor such as a pattern falling.

Also here, the explanation has been given regarding the case where the plural-threshold-values-used judgment processing is performed. In addition thereto, however, the following judgment processing is also implementable: Namely, if the large-variation region exceeds a predetermined range, it can be judged that the pattern falling occurs. Meanwhile, if the region falls into this range, it can be judged that the scums exist. Here, this predetermined range can be determined as follows, for example: The average value or standard deviation of the error values is determined for each partition region which is specified into a constant size. Then, the predetermined range can be determined by defining, as the criterion, the condition as to whether or not the number of large-variation partition regions exceeds a predetermined number.

Moreover, in the above-described example, the judgment processing has been performed by utilizing the errors of the intervals between the upper-portion contour data 2701 and the lower-portion contour data 2702. As another judgment criterion, however, the following judgment criterion is also implementable: Namely, it can also be judged whether the pattern falling occurs or the scums exist by analyzing the frequency of the edge of a pattern acquired from the SEM image. Concretely, if the frequency within a predetermined region in the SEM image is higher than a constant value, it can be judged that a locally-protruding scum exists. Meanwhile, if the frequency is a comparatively low frequency, it can be judged that there occurs a fluctuation which is caused to occur by the pattern's inclination.

In addition to the above-described pattern-falling detection method, there also exists a pattern-falling detection method where the pattern falling is detected based on the luminance information on the SEM image. If a pattern falling occurs, the widths of a white band acquired based on the luminance information on the pattern's image differ from each other on the right and left side walls. Accordingly, as illustrated in (d) in FIG. 36, the pattern falling can be detected by measuring the dimensions of line profiles corresponding to the right and left widths. Concretely, the pattern's right and left side walls are identified by superimposing the SEM image and the design data on each other. Next, the luminance-information-based line profile is created from the SEM image in a predetermined region on each of the right and left. Moreover, the comparison is made between the widths of the white band from a peak position of the line profile. Then, if, as a result of this comparison, a constant or more difference occurs between the right and left, it can be judged that the pattern falling occurs.

Figure 44A:
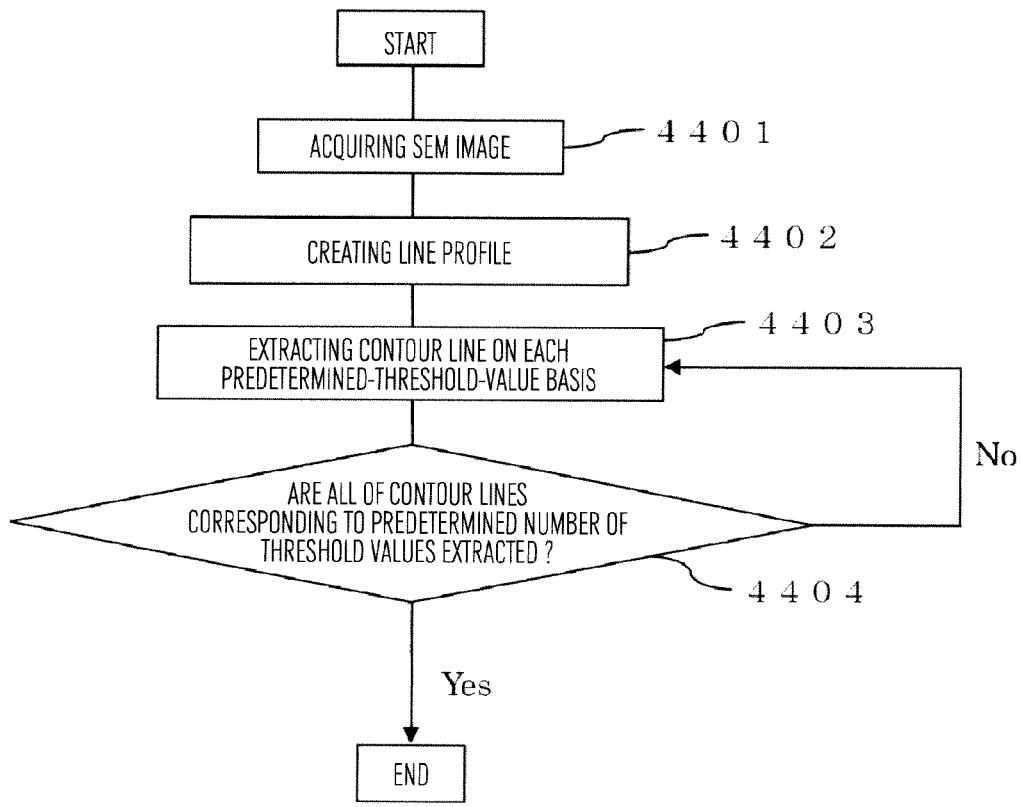
FIG. 44A This is a flowchart for explaining steps of creating contour-line data on the portion of a pattern at its arbitrary upper portion, lower portion, and its arbitrary height position.
Figure 44B:
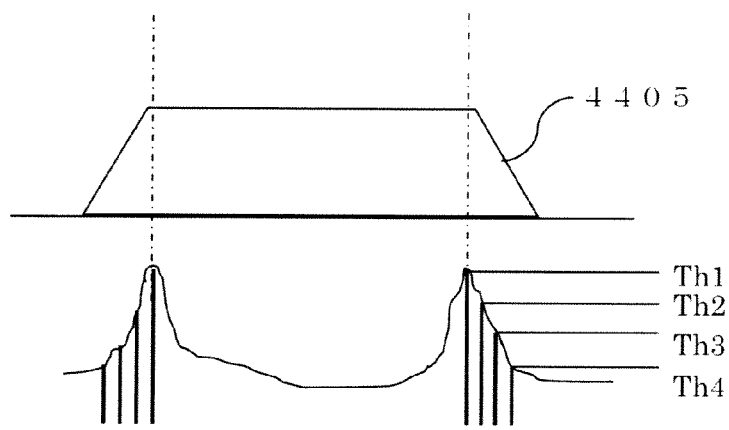
FIG. 44B This is a diagram for explaining the steps of creating the contour-line data on the portion of the pattern at its arbitrary upper portion, lower portion, and its arbitrary height position.
Figure 44C:
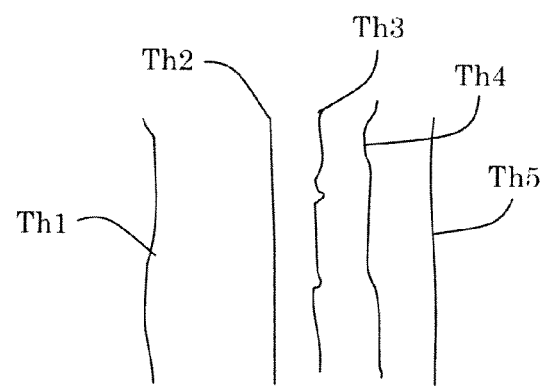
FIG. 44C This is a diagram for explaining the steps of creating the contour-line data on the portion of the pattern at its arbitrary upper portion, lower portion, and its arbitrary height position.
Figure 44D:
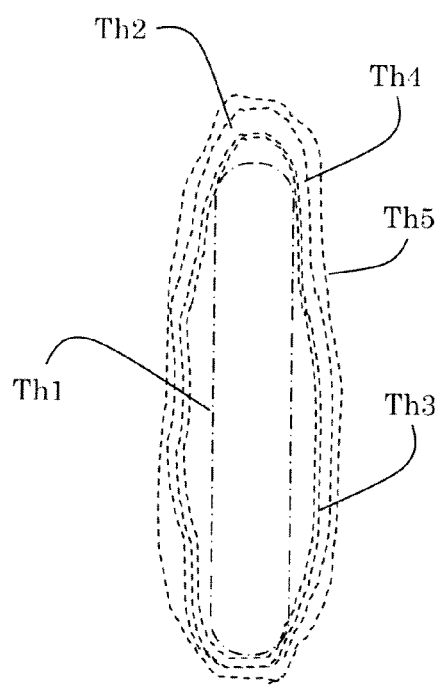
FIG. 44D This is a diagram for explaining the steps of creating the contour-line data on the portion of the pattern at its arbitrary upper portion, lower portion, and its arbitrary height position.

Here, referring to FIG. 44A to FIG. 44D, the explanation will be given below concerning a concrete example of the following method: Namely, in the above-described scum detection, or distinction between scums and a pattern falling, this method creates the upper-portion contour data on the portion of a pattern at its upper portion, the lower-portion contour data on the portion of the pattern at its lower portion, and the contour data on the portion of the pattern at its arbitrary height position. FIG. 44A is a flowchart for indicating the steps of creating these pieces of contour-line data. First, the SEM image of a pattern, i.e., the evaluation target, is acquired using the SEM 201 (step 4401). After that, the line profile is created based on the luminance information on the image (step 4402). Here, as illustrated in FIG. 44B, the line profile exhibits a tendency that the signal intensity becomes higher and sharper in its location where the inclination of the pattern 4405 is larger. Accordingly, a plurality of threshold values are set in advance for the line profile acquired. Then, a contour line is extracted by connecting to each other the on-image locations that indicate the threshold values on each threshold-value basis (step 4403). This extraction is performed with respect to the predetermined number of threshold values set, thereby extracting a plurality of length-measurement contour lines (step 4404). Also, the step 4404 can be omitted, and the threshold values can be set in advance such that all of the contour lines corresponding to the predetermined number of threshold values are extracted. FIG. 44C illustrates an example (enlarged view) where a plurality of threshold values are set for the line profile thereby to extract a plurality of contour lines. In the case of the example in FIG. 44C, the contour lines are extracted such that, if the peak portion of the line profile is set at 100% (i.e., Th 1), the other portions Th 2 to Th 5 are changed in accordance with a constant ratio. The threshold values are made settable by various methods. FIG. 44D is a diagram where the contour lines that are extracted for each of the predetermined number of threshold values are superimposed on each other, and are seen from the above.

The utilization of the plurality of threshold values extracted in this way also makes it possible to measure an arbitrary-inter-contour-lines interval for the respective contour lines. This measurement is made possible in addition to the case described earlier: Namely, in the scum detection or the judgment on a pattern falling, the intervals (i.e., error values) 2703 between the upper-portion contour data 2701 and the lower-portion contour data 2702 are measured all-inclusively for the scum-detection target region 2704.

Figure 29:
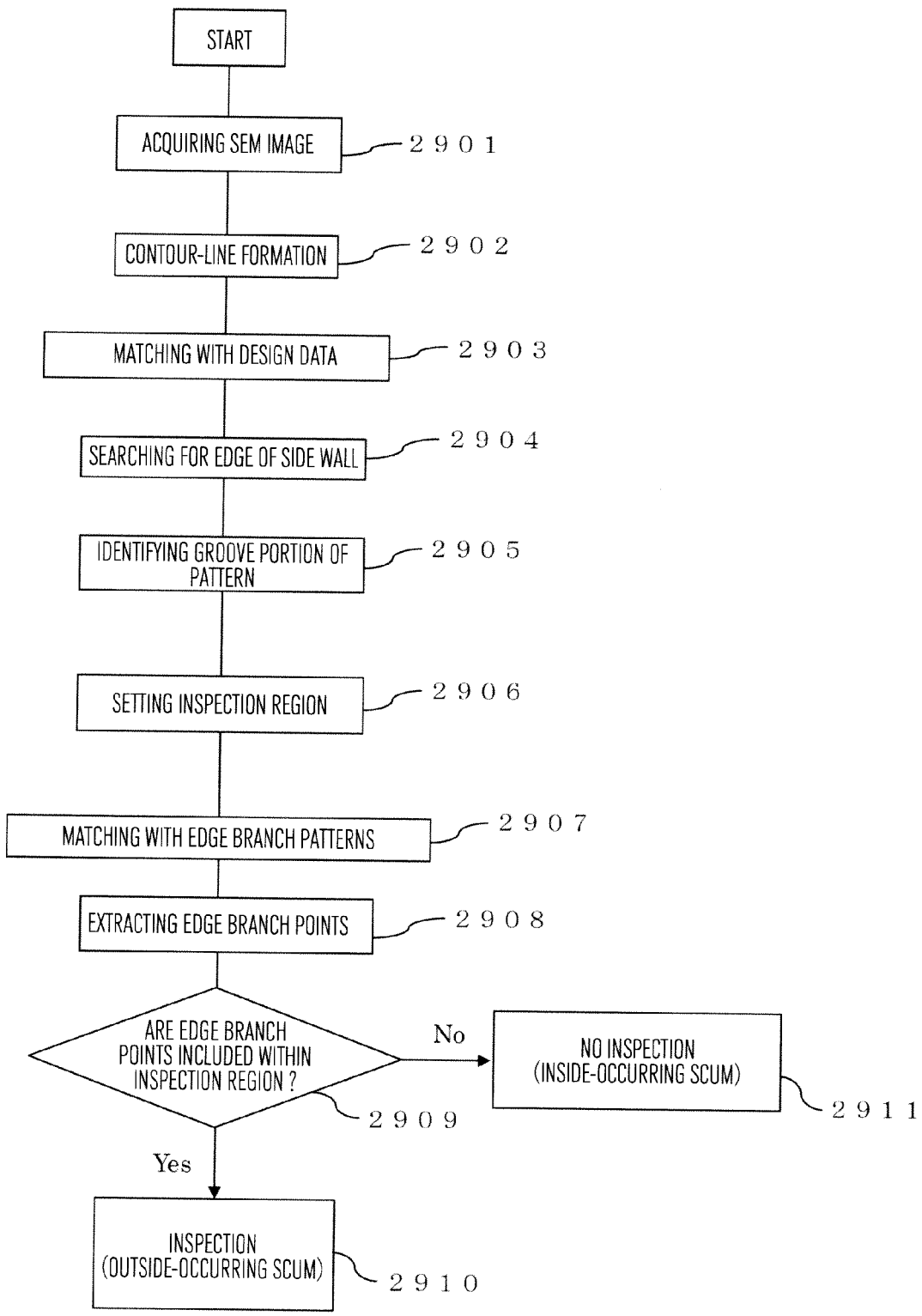
FIG. 29 This is a flowchart for explaining steps of detecting scums by identifying groove portions of a pattern on the basis of the matching between the contour-line data on the pattern and the design data thereon.
Figure 31:
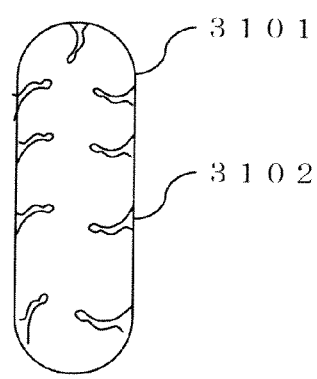
FIG. 31 This is a diagram for indicating the surface roughness of a pattern.

Next, the explanation will be given below concerning the following method: Namely, in this method, the occurrence direction of scums is identified, thereby selectively detecting only a real scum that is caused to occur on the outside of the surface of a pattern. Depending on the conditions in the semiconductor fabrication process, as illustrated in FIG. 31, the shape that looks like a kind of roughness is sometimes caused to occur on the inside of the pattern's surface. In a case like this, it is desirable to selectively employ, as the inspection target, only the real scum that becomes a direct cause for the pattern's short-circuit. Here, however, the execution of the pattern-matching processing described earlier (, where the image templates such as the edge branch patterns are used) results in the scum's uniformly-mannered detection as a mere scum, regardless of whether this mere scum is the real scum that occurs on the outside of the pattern's surface, or the surface's roughness that occurs on the inside of the pattern's surface. This scum's uniformly-mannered detection makes it impossible to make the distinction between the real scum and the surface's roughness. In view of this situation, referring to FIG. 29, the explanation will be given below regarding an example of the following scum-judgment processing steps: Namely, a groove portion of the pattern is identified based on the matching with the design data. Then, an edge branch point is detected after an inspection region is set with this groove portion as the target. Here, the data used as the design data is the one to which the information on the pattern's inside and outside are added.

Figure 32:
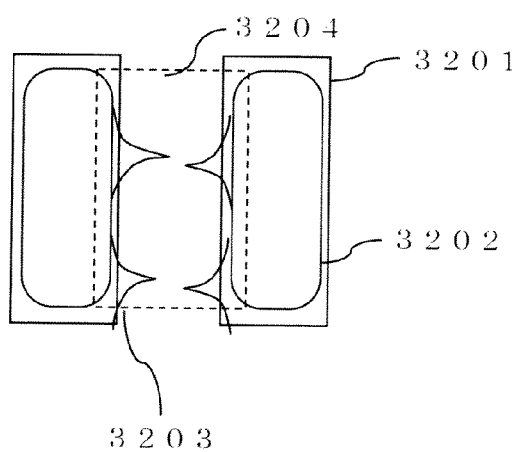
FIG. 32 This is a diagram for explaining an example where the scum-detected target region is set.

First, the SEM image is acquired using the SEM 201 (step 2901). After that, the contour data, which represents the pattern's edges as 1-pixel-width edges, is extracted in accordance with the processing steps illustrated in FIG. 10 (step 2902). Next, the position alignment is implemented by performing the pattern matching between the design data and the contour data (step 2903). Next, the edge of the side wall is searched for (step 2904), thereby identifying the groove portion of the pattern (step 2905). Incidentally, here, the contour-line formation at the step 2902 may also be performed after the matching at the step 2903 is performed. Next, the inspection region is set based on the information about the identified groove portion of the pattern (step 2906). Here, it is desirable that the inspection region be so set as to include the groove portion of the pattern as is illustrated in FIG. 32. This is because the setting like this allows the surface's roughness, which occurs on the inside of the pattern, to be excluded from the inspection target. Next, the pattern matching between the edge branch patterns and the contour data is performed (step 2907), thereby extracting the edge branch points contained in the contour data (step 2908). Moreover, it is judged whether or not the edge branch points extracted are included within the inspection region (step 2909). Then, if the edge branch points are included therein, the inspection is performed as the real scum that occurs on the outside of the pattern (step 2910). Meanwhile, if the edge branch points are not included therein, no inspection is performed as the surface's roughness that occurs on the inside of the pattern (step 2911). The above-described processing steps also make it possible to determine the statistics of the real scum that occurs on the outside of the pattern, and the surface's roughness that occurs on the inside of the pattern. Also, the judgment at the step 2909 can be omitted, and the conditions can also be set in advance such that the extraction of the edge branch points is performed with only the inspection region employed in advance as the inspection target.

Figure 30:
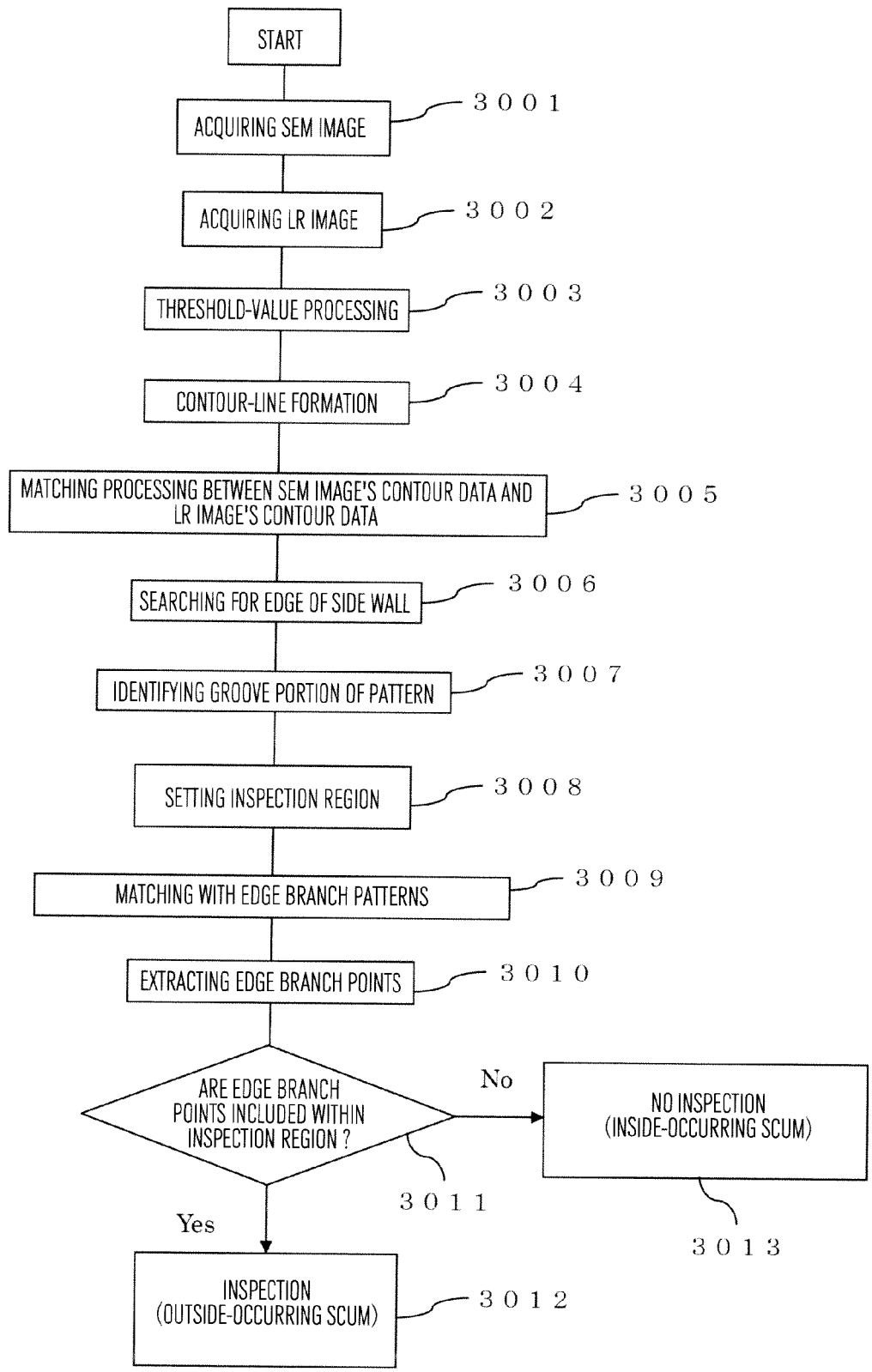
FIG. 30 This is a flowchart for explaining steps of detecting scums by identifying groove portions of a pattern on the basis of the matching between the contour-line data on the pattern and the LR image of the pattern.

Also, the scum judgment can also be made by using the LR image of the sample (i.e., FIG. 30), instead of the design data used for the pattern-matching processing at the step 2903 of the above-described flowchart. In this case, after the SEM image and the LR image are acquired (steps 3001 and 3002), the binarization processing using a threshold value (step 3003) and the contour-data extraction (step 3004) are applied to each of the SEM image and the LR image. After that, the pattern-matching processing can be performed between the SEM image's contour data and the LR image's contour data (step 3005). The following steps 3006 to 3012 are basically the same as the steps 2904 to 2910 in FIG. 29. The case where the LR image is used allows the actual-pattern-approximating higher-reliability pattern-matching processing to be executed as compared with the case where the design data is used.

Also, the edge branch point is extracted for all of the regions without setting the inspection region at the step 2906. Moreover, the identification information for identifying whether or not the region is the pattern's groove portion is memorized into the memory unit of the database, which is illustrated in FIG. 16, in a manner of being made related with the information about the edge branch points extracted. Here, the pattern's groove portion is identified from the edge information acquired by the matching processing with the design data or the like. The execution of this related memory allows execution of the statistical processing. The execution of this statistical processing, further, allows acquisition of the relationship between the surface's roughness of the pattern, and the occurrence number of the real scums.

Next, the explanation will be given below concerning the extent of the occurrence of a scum, and the degree-of-risk level of this scum. FIG. 33 is a diagram for indicating the relationship between the cross-sectional views and top views (, which illustrate the extent of the occurrence of a scum that has occurred in the space (i.e., groove portion) between wiring patterns), and the degree-of-risk level of this scum. Incidentally, the scum illustrated in the present diagram is only an example. Namely, naturally, the scum's occurrence form is not limited thereto.

Figures 38, 39:
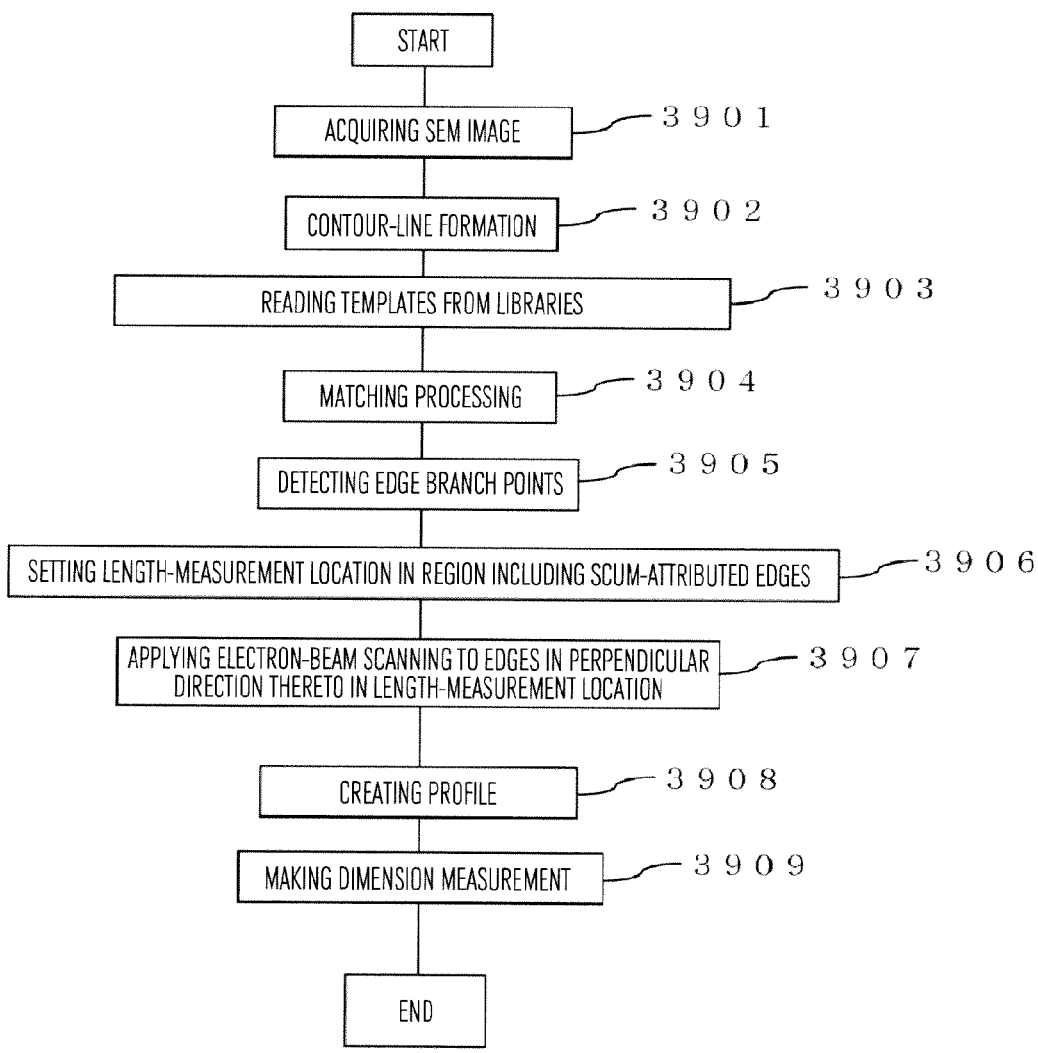
FIG. 38 This is a diagram for indicating the relationship between the width and height of a scum, which is caused to occur among a plurality of line patterns, and the degree-of-risk level of the scum.
FIG. 39 This is a flowchart for explaining steps of making the dimension measurement on the width of a scum caused to occur among a plurality of line patterns.

As is exactly illustrated in the present diagram, the form of a scum, which will occur on the groove portion between the wiring patterns, grows as follows: Namely, at an initial stage of its occurrence, the scum is so formed as to extend locally over the bottom portion of the patterns. Here, even if two scums have occurred on the groove portion from the adjacent patterns in a manner of opposing to each other, an interval still exists therebetween (: degree-of-risk level 1). At the next stage, the scum's occurrence level becomes higher than the above-described case. Concretely, both of the scums are connected to each other as a result of having become larger in the longitudinal and transverse directions, or the height direction. Moreover, similar phenomena are observed at a plurality of locations in some cases (: degree-of-risk level 2-3). Furthermore, if the occurrence level becomes even higher, a scum is formed which is equipped with its constant width or height (: degree-of-risk level 4). FIG. 38 indicates the relationship between the extent of the width and height of a scum that has occurred, and the degree-of-risk level of this scum. What is referred to as "the degree-of-risk level" here means the easiness with which the short-circuit of the patterns will take place, the extent of the difficulty with which this scum can be removed, and the like. Namely, a microscopic scum whose occurrence level is low is removable in the fabrication process. However, the higher the scum's occurrence level becomes, the more difficult the scum's removal becomes. Consequently, it is requested to quantitatively evaluate a scum that has occurred.

In view of this situation, next, the explanation will be given below regarding a method of quantitatively evaluating the width and height of a scum that has occurred. FIG. 39 is a flowchart for indicating an example of the processing steps of making the dimension measurement on the width of a scum that has occurred among a plurality of line patterns.

Figure 40:
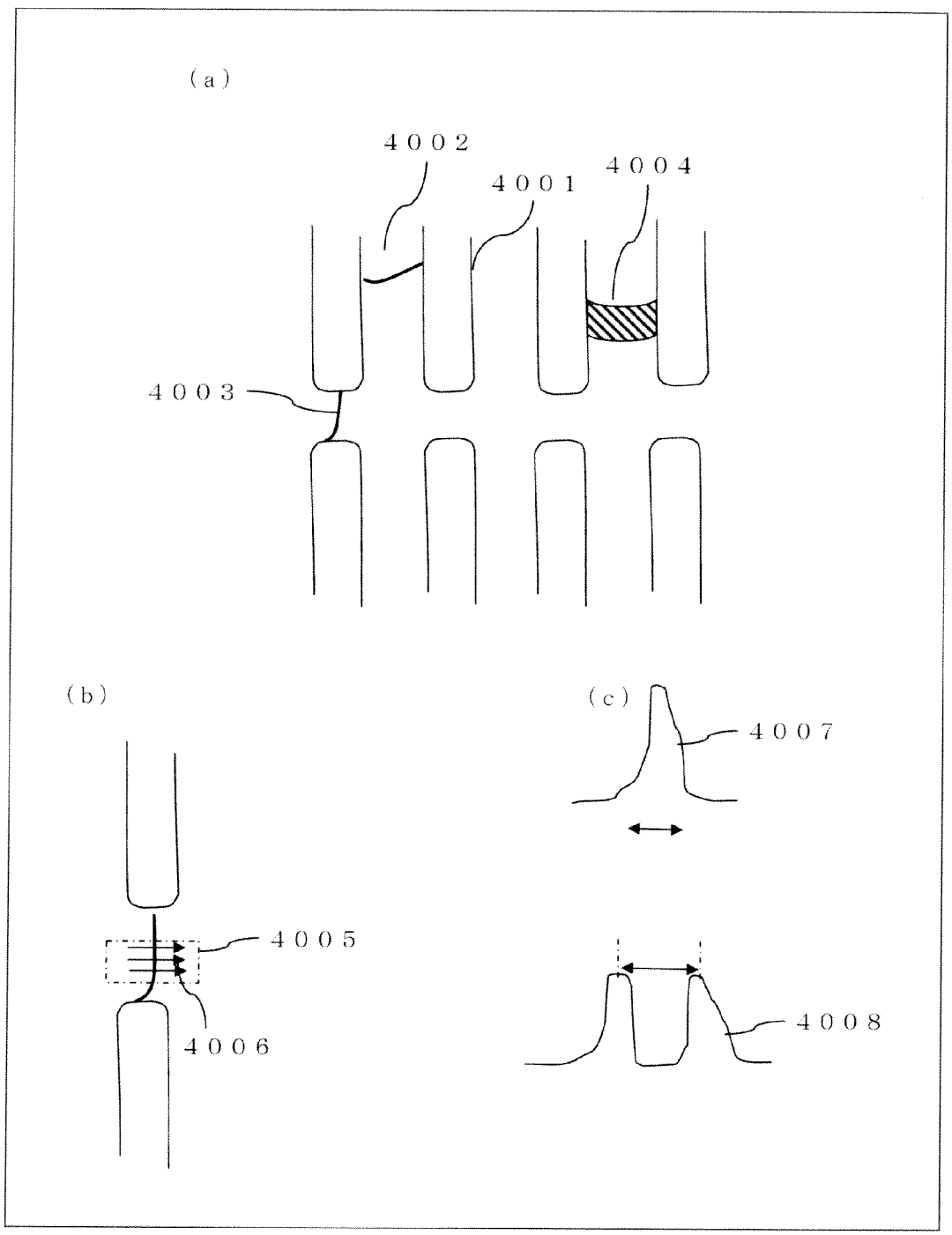
FIG. 40 This is a diagram for explaining an example of making the length measurement on the width of a scum caused to occur among a plurality of line patterns.

First, after the SEM image is acquired using the SEM 201 (step 3901), the contour-line data is created (step 3902). Here, the creation of the contour-line data can be performed using the above-described threshold-value processing, or the above-described establishment of the correspondence relationship with the design data. In the example of a diagram (a) in FIG. 40, scums 4002, 4003, and 4004 have occurred among a plurality of line patterns 4001. Also, a diagram (b) in FIG. 40 illustrates the example of making the dimension measurement on the width of a scum that has occurred between line patterns. Here, next, templates are read from plural types of libraries in accordance with the processing steps illustrated in FIG. 15 (step 3903). Moreover, the matching processing using each template is performed (step 3904), thereby detecting edge branch points (step 3905). Still next, a length-measurement location 4005 is set for a region which includes, of a plurality of edges that constitute the edge branch points, edges that are not attributed to the original patterns, but, namely, are attributed to the scum (step 3906). At this time, it is preferable to set the length-measurement location 4005 into a direction which allows the sharpest acquisition of the peak of a profile that will be created at a step 3908. In particular, the length-measurement location 4005 is set in such a manner that the location 4005 becomes perpendicular to the above-described scum-attributed edges. This perpendicular setting makes it possible to acquire a high-precision length-measurement result as will be described later. Furthermore, the scanning with an electron beam is applied to the scum-attributed edges in a manner of being perpendicular to the scum-attributed edges in the length-measurement location 4005 set as described above (step 3907). In addition, the above-described profile is created from a secondary-electron signal detected from the scum-attributed edges (step 3908), thereby making the dimension measurement on the width of the scum (step 3909).

In the above-described flowchart, the length-measurement location has been set for the region which includes the scum-attributed edges, and then the scanning with the electron beam has been applied thereto. In this region, however, the profile may also be created from a signal which is acquired based on the SEM image's luminance information acquired in advance at the step 3901. At this time, it is desirable to acquire the luminance information in the direction that becomes perpendicular to the direction of the scum-attributed edges.

Here, the explanation has been given regarding the processing steps of making the length measurement on the width of the scum in the uniform manner for the extracted edge branch points. If, however, the edge branch points satisfy a predetermined condition, the above-described technique may also be used in a selective manner. For example, when the plurality of edge branch points are extracted, it is judged from the characteristics of the templates whether or not the detected edge branch points are connected to each other by a single line, i.e., the detected edge branch points are in a state of being connected to each other as a same scum. Then, if the edge branch points are so judged as to form the same scum, the length-measurement location 4005 is so set as to become perpendicular to edges that are attributed to the same scum. Meanwhile, if the edge branch points are not so judged as to form the same scum, this case can be regarded as a non-target for the dimension measurement on the scum's width. Also, the above-described predetermined condition is not limited to this example. Namely, various types of conditions can be set, depending on the situations. For example, even when the edge branch points do not form the same scum as described above, if the degree-of-risk level is judged to be high as a result of measuring the scum's length in accordance with the method illustrated in FIG. 18, the judgment criterion can also be so set as to regard this case as a target for the dimension measurement on the scum's width. Arrows 4006 illustrated in (b) in FIG. 40 indicate the scanning direction of the electron beam. The above-described processing steps allow the dimension of a scum, which is employed as the evaluation target, to be measured in the selective manner.

Here, if a wide-width-equipped scum occurs like, e.g., the scum 4004 illustrated in (a) in FIG. 40, it is assumed that two pieces of contour-line data are created at both-ends portions of this scum. In a case like this, if the distance between these two pieces of contour-line data created satisfies a predetermined condition (e.g., this distance is shorter than a distance determined in advance), these contour-line data are so judged as to form a same scum. Accordingly, the dimension measurement on the scum's width is made. Also, in the case of the scum 4002 or 4003, the profile is created from the SEM image's luminance information. At this time, it is conceivable that a single peak occurs like a profile 4007 illustrated in (c) in FIG. 40. Consequently, in the case like this, by measuring the distance between the start point and the end point both of which form this single peak, it becomes possible to make the dimension measurement on the scum's width. However, in the case of the wide-width-equipped scum like the scum 4004 illustrated in (a) in FIG. 40, it is conceivable that two peaks occur like a profile 4008 illustrated in (c) in FIG. 40. In this case, an algorithm is made available which allows the measurement on the inter-two-peaks distance as the dimension of the scum's width. As having been described so far, it is possible to appropriately select the scum's width measurement methods, depending on the state of a scum that will occur.

Figure 41:
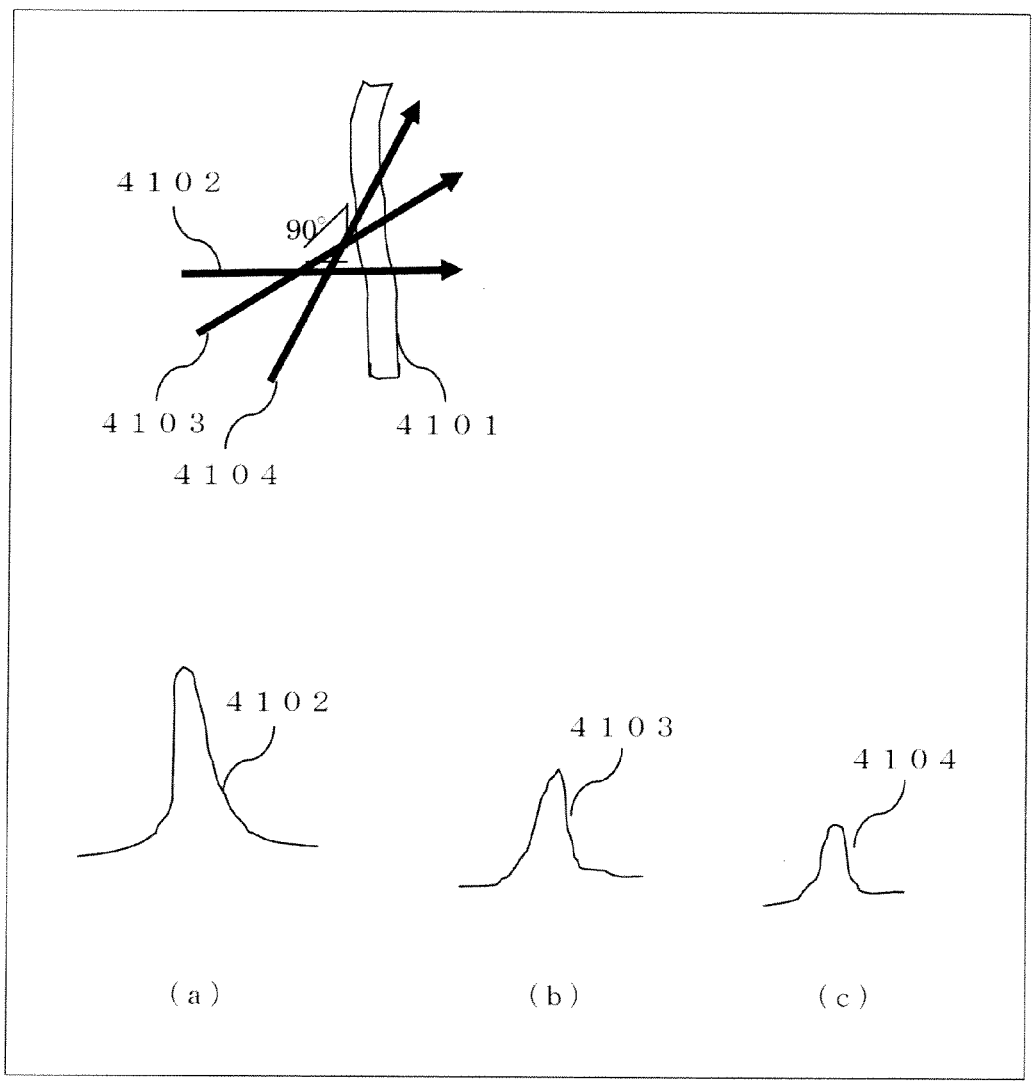
FIG. 41 This is a diagram for indicating the relationship between the scanning direction of an electron beam with respect to the contour-line data on a scum, and the line profile formed from the SEM image.

Next, the explanation will be given below concerning the reason why the scanning with the electron beam is performed in the state where the length-measurement location is so set as to become perpendicular to the scum-attributed edges. FIG. 41 is a diagram for indicating the relationship between the electron beam's scanning directions 4102, 4103, and 4104 with respect to contour-line data 4101 for indicating the scum's edge, and the profile that is created from the secondary-electron signal generated from the scum-attributed edges. Depending on the differences in the electron beam's scanning directions 4102, 4103, and 4104 with respect to the scum's contour-line data 4101, the shape of the created profile also changes as is illustrated in (a) (b), and (c) in FIG. 41. Here, the electron beam's scanning direction 4102 is a direction which forms 90° with respect to the scum's contour-line data, i.e., which becomes perpendicular thereto. This direction 4102 makes it possible to create the highest-peak profile as illustrated in (a) in FIG. 41.

Figure 42:
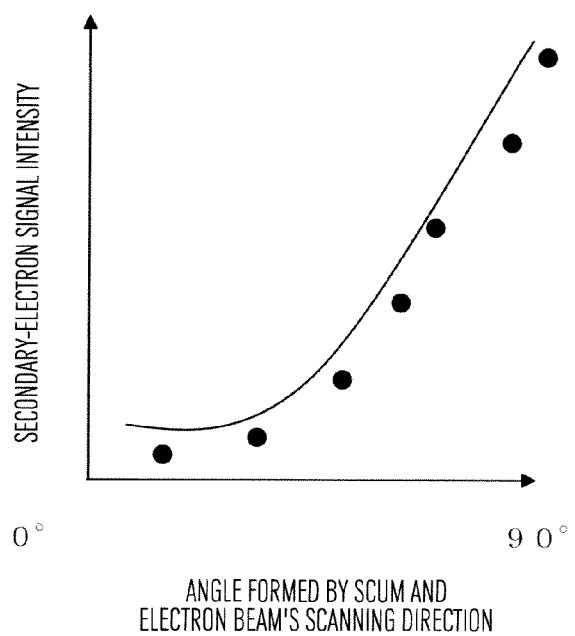
FIG. 42 This is a diagram for explaining the relationship between the secondary-electron signal intensity, and an angle formed by the electron beam's scanning direction and the scum.

Also, it is assumed that, as illustrated in FIG. 42, there exists a certain constant tendency (i.e., relative relationship) between the detected secondary-electron signal intensity and an angle formed by the electron beam's scanning direction and the scum. The present diagram shows the following fact: Namely, it becomes possible to acquire the largest signal intensity by performing the electron-beam scanning into a direction which is perpendicular to the scum's edge. The above-described case exhibits basically the same tendency as the electron beam's scanning direction with respect to the pattern's edge direction. Consequently, the execution of the high-reliability scum's width dimension measurement makes it desirable to set the length-measurement location in the selective manner as was described earlier.

Figure 43:
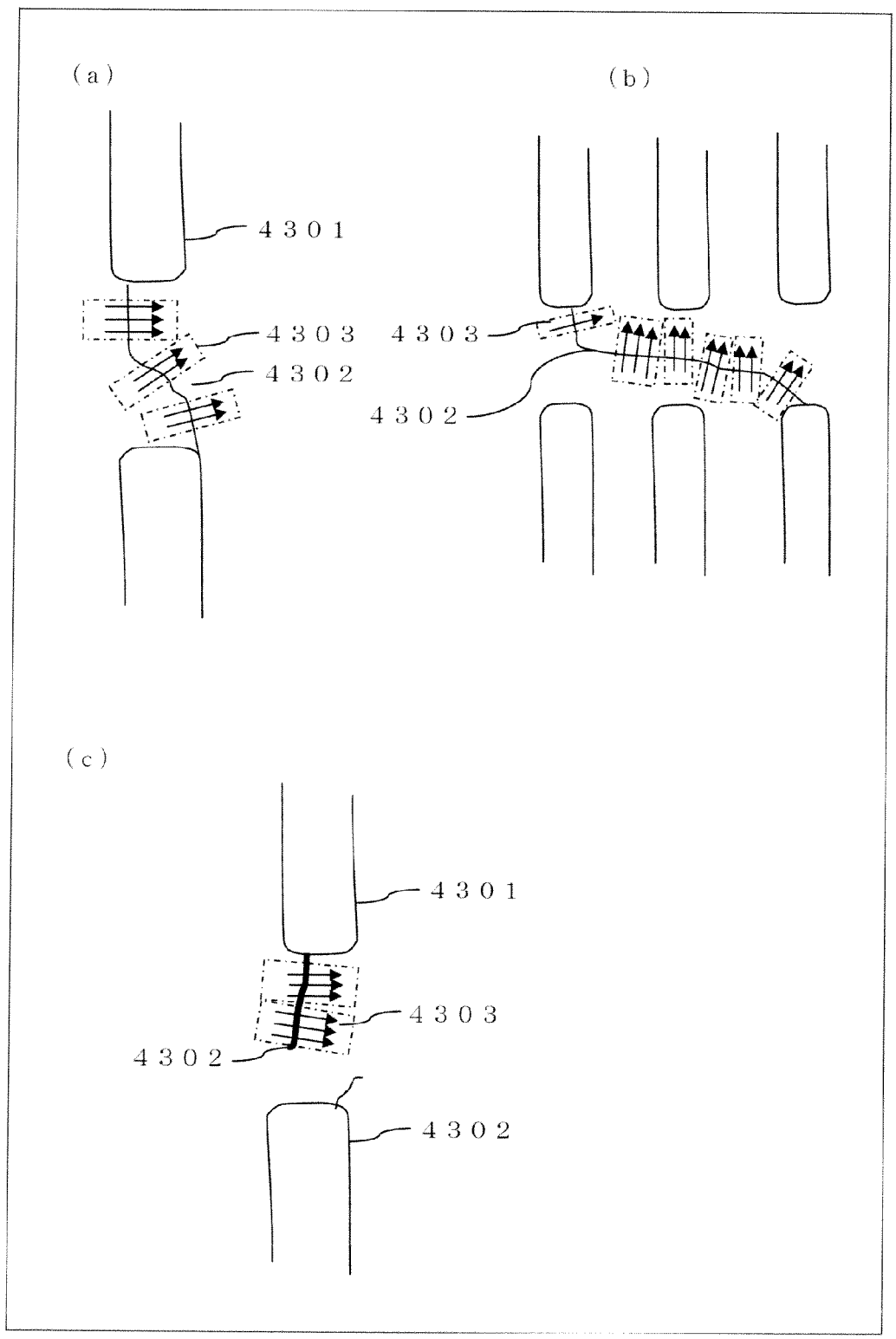
FIG. 43 This is a diagram for indicating variations in the setting method of setting a length-measurement location.

FIG. 43 indicates variations in the setting method of setting the length-measurement location. In association with the occurrence of a scum 4302, there are various cases of its occurrence form. Namely, in addition to the case where, as was explained in (b) in FIG. 40, a scum occurs in one direction, the following cases exist: For example, as illustrated in (a) in FIG. 43, a scum occurs in a direction that is oblique to a pattern 4301, and in a manner of being deformed as if it describes a curve. Otherwise, as illustrated in (b) in FIG. 43, a scum occurs between patterns that are positioned at places where they are neither adjacent nor opposed to each other. In these cases, a length-measurement location 4303 is set for each of a plurality of regions of the scum that has occurred. Then, the electron-beam scanning can be performed always in the perpendicular direction to the scum within whatever region. Also, the electron-beam scanning can also be so performed as to always become perpendicular to the scum by adjusting the electron beam's scanning direction within a single length-measurement location 4303. Also, a diagram (c) in FIG. 43 indicates a case where a plurality of scums 4302 that have occurred are not in the connection state of being connected to each other. This case can be regarded as the non-target for the dimension measurement on the scum's width, and the length-measurement location 4303 is not set in accordance with the judgment processing at the step 3906. If, however, the length of the scum 4302 becomes longer than a predetermined condition as described earlier, the length-measurement location 4303 can be set in the perpendicular direction thereto with only this scum employed as the measurement target.

Furthermore, information about the position of a pattern, such as, e.g., information indicating whether or not another pattern proximate thereto exists, is beforehand acquired using the design data. Then, if a scum is detected, the length-measurement location 4303 is set in such a manner as to include this beforehand-grasped proximate pattern, and the electron-beam scanning can be performed. As was explained in FIG. 33, a scum has a possibility of being connected to a pattern proximate thereto. Accordingly, in this way, the length-measurement location 4303 is set based on the pattern's position relationship acquired from the design data. This setting method allows only a partial portion of the scum to be detected by the extraction of edge branch points. Meanwhile, regarding a portion that is continues to the scum, this setting method allows the actually-existing-stated scum to be detected with a high precision, even if the scum-continuous portion could not be detected.

In the above-described embodiment, the explanation has been given regarding the technique of quantitatively evaluating the width of a scum. Next, the explanation will be given below concerning a method of evaluating the height of a scum. Making the evaluation of the height of a scum allows recognition of the following type of scum: Namely, for example, even if a plurality of scums are connected to each other, or even if the dimension of the length or width of a scum is larger than a constant value, this scum does not grow in the height direction actually. Namely, its degree-of-risk level is not so high, and thus this scum is removable. Also, if only the height of a scum exerts a tremendous influence on its degree-of-risk level, it is effective to make the evaluation of the height of this scum solely after the scum's detection.

Figure 45:
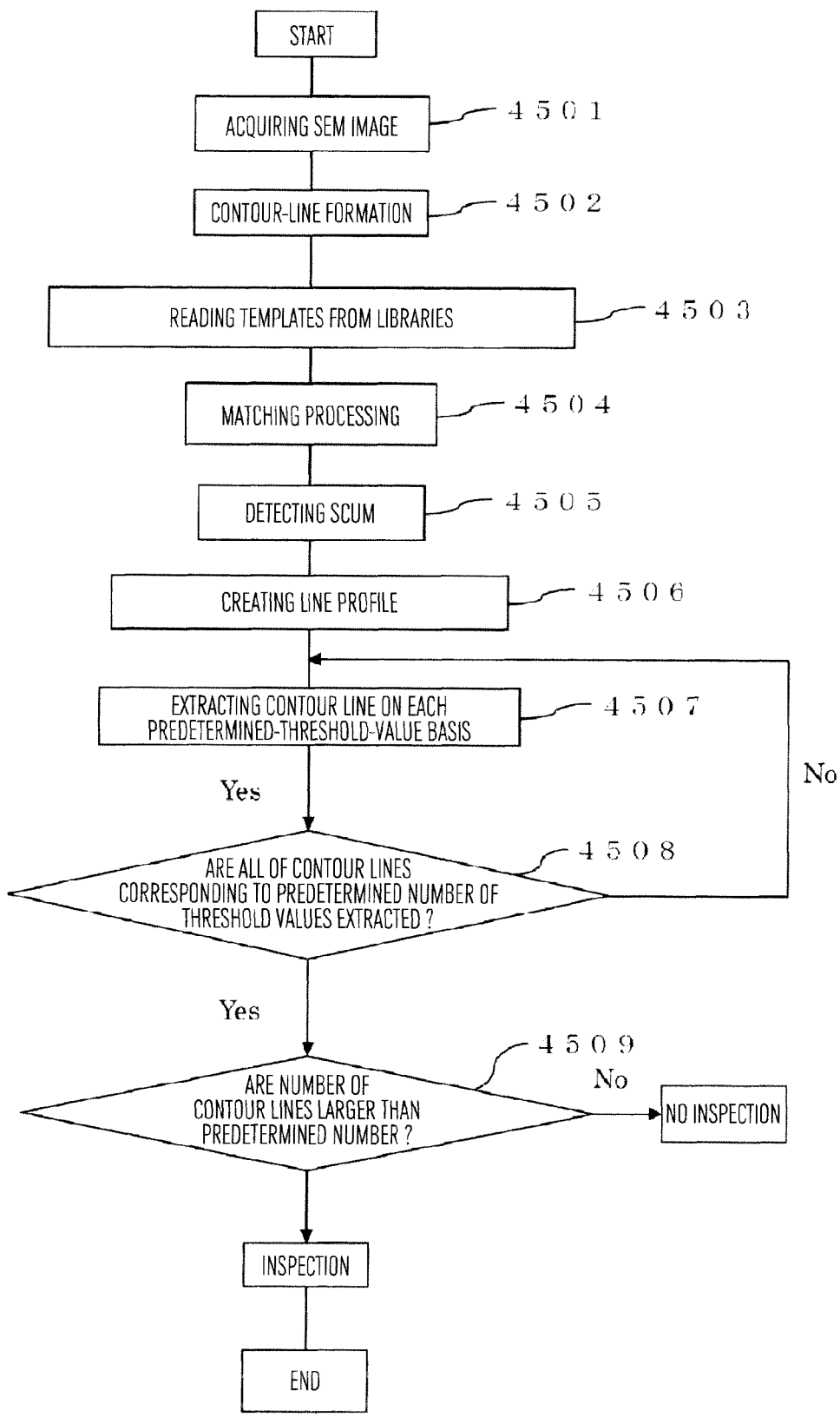
FIG. 45 This is a flowchart for explaining steps of evaluating the height of a scum by extracting the contour-line data from the scum's SEM image.

Accordingly, referring to FIG. 45, the explanation will be given below concerning an example of the processing steps of evaluating the height of a scum by extracting the contour data from the scum's SEM image. Incidentally, these processing steps are applicable to a scum that is detected based on the technique described earlier, in accompaniment with the various evaluations such as the measurement on the dimension or width of this scum. The application of these processing steps, however, can be performed selectively only when the detected scum is so judged as to be equipped with a constant width. First, the SEM image is acquired (step 4501). After that, the contour data, which represents the pattern's edges as 1-pixel-width edges, is extracted in accordance with the processing steps illustrated in FIG. 10 (step 4502). Next, the templates, i.e., the edge branch patterns, are read from the libraries described earlier (step 4503). Moreover, the matching processing therebetween is performed (step 4504), thereby extracting edge branch points to perform the detection of a scum therebetween (step 4505). Furthermore, the line profile of a region which includes the scum detected is created in the SEM image (step 4506). In the creation of this profile, the image may be acquired by setting the length-measurement location again in the scum-detected region. Otherwise, of the profiles to be created from already-acquired images, only the portion of the scum-detected region may be used selectively. Next, as was explained in FIG. 44A, a contour line is extracted for each of a predetermined number of threshold values set in advance (step 4507). Then, all of the contour lines corresponding to the predetermined number of threshold values are extracted (step 4508). At this time, the height of the profile is so set as to be equipped with a constant interval for each of the predetermined number of threshold values. As a result of this setting, the plurality of contour lines acquired become the so-called contour lines (i.e., equal-height lines). At this time, it is desirable not to perform an operation that will exert an influence on the form of the profile, such as an automatic adjustment of the image's contrast/brightness. This not-to-perform-the-operation is desirable in order to evaluate the height of the profile with a constant criterion always used under whatever conditions.

Subsequently, the plural pieces of contour data are formed from the scum's lower-portion contour data to upper-portion contour data. At this time, if the number of these pieces of contour data is larger than a predetermined number, for example, (step 4509), this scum is so judged as to be a high-degree-of-risk scum which is equipped with a certain extent of height. Accordingly, this scum is regarded as an inspection target (step 4510). Meanwhile, a scum other than this one can be regarded as a non-inspection target (step 4511).

Figure 35:
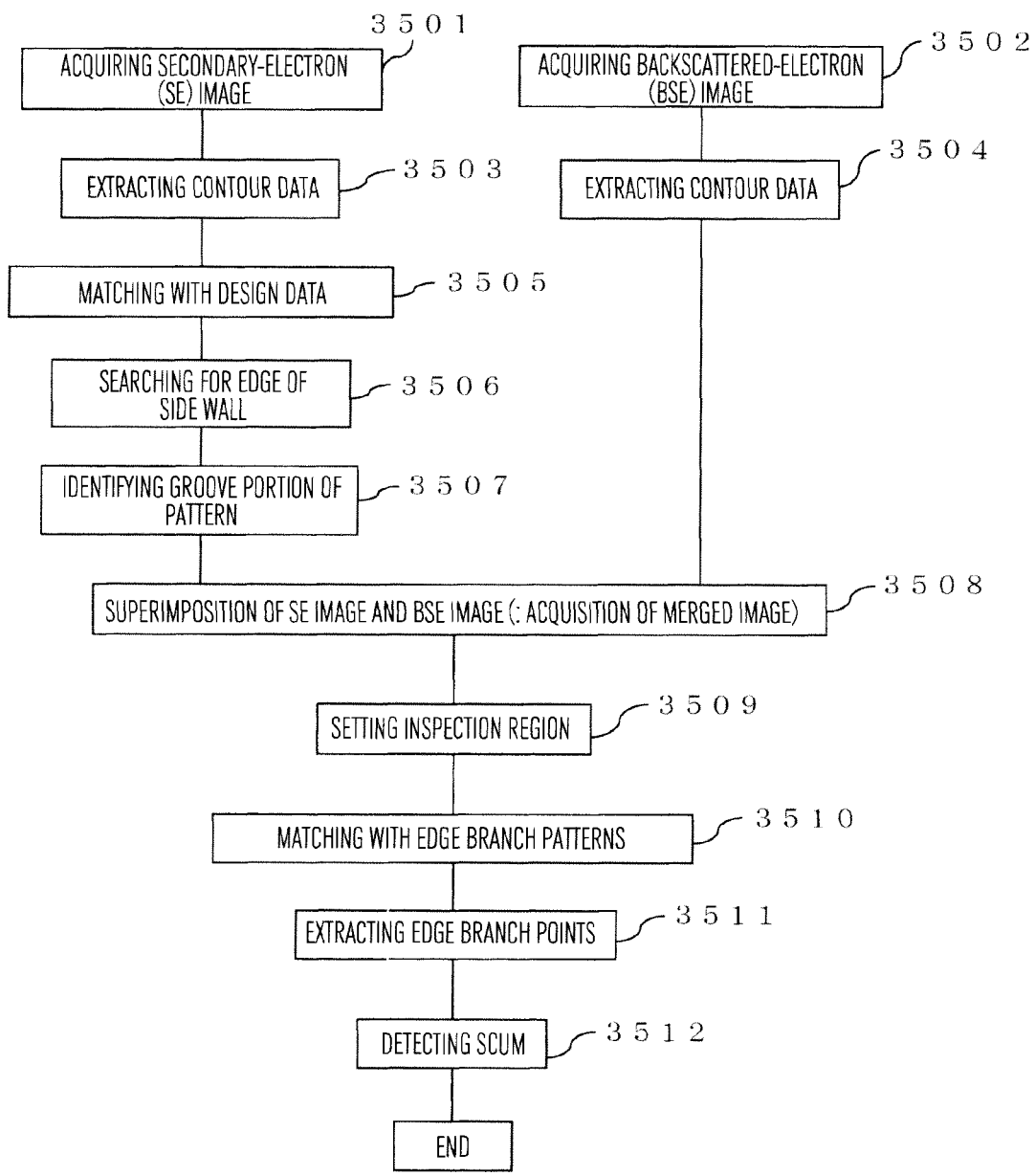
FIG. 35 This is a flowchart for explaining steps of detecting a scum by using a backscattered-electron image.

Next, the explanation will be given below regarding an example of performing the scum detection by utilizing a secondary-electron image (which, hereinafter, will be referred to as "SE image") and a backscattered-electron image (which, hereinafter, will be referred to as "BSE image"). In the case of the scum detection where the SE image is utilized, the number of electrons detected at the edge of a pattern increases because of the edge effect. As a consequence, the edge's luminance becomes higher, thereby resulting in no implementation of the image's contrast. This situation, in some cases, makes it difficult to detect the scum. In view of this situation, referring to FIG. 35, the explanation will be given below concerning an example of the processing steps of detecting a scum by utilizing the BSE image.

Figure 34:
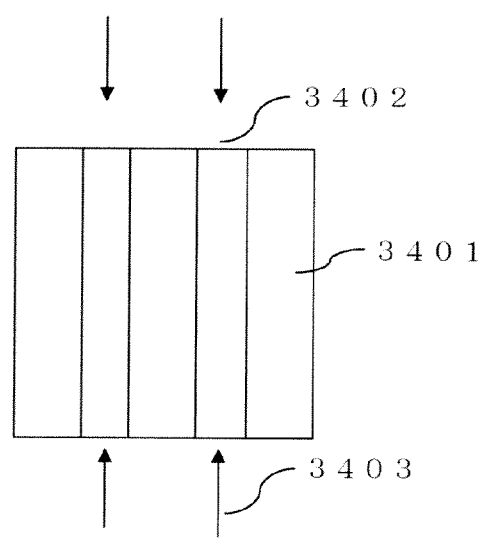
FIG. 34 This is a diagram for explaining an example where a scum is detected by using a backscattered-electron image.

First, the SE image and the BSE image are acquired, respectively (steps 3501 and 3502). Here, at the time of acquiring the BSE image, it is desirable to use a detector for detecting electrons that are backscattered into a direction which becomes parallel to the pattern, and which is denoted by an arrow 3401 illustrated in FIG. 34. Each BSE is a signal electron whose energy is higher than that of each SE. This condition allows the detection that uses the detector which is set at a desired position like this. In particular, in the above-described scum that has occurred on the groove portion between the wiring patterns, the detection amount of the electrons backscattered into the direction parallel to the pattern reflects the extent of the scum's occurrence more precisely as compared with the detection amount of electrons that are backscattered into a direction perpendicular to the pattern. This condition makes it desirable to selectively detect the BSEs that are backscattered into the direction parallel to the pattern. Next, the contour data is extracted with respect to both of the images, using the technique described earlier (steps 3503 and 3504). Here, with respect to the SE image, the position alignment is implemented by performing the matching processing with the design data (step 3505). Moreover, the edge of the side wall is searched for (step 3506), thereby identifying the groove portion of the pattern (step 3507). Next, the SE image and the BSE image are superimposed on each other, and adjustments are made regarding such factors as the focal point and contrast, thereby acquiring a merged image (step 3508). Still next, an inspection region is set for the merged image acquired by the superimposition (step 3509). Furthermore, the pattern matching with the edge branch patterns is performed (step 3510), thereby extracting edge branch points (step 3511). After that, the scum is detected (step 3512).

According to the processing steps described so far, the superimposition of the SE image and the BSE image makes it easier to detect a scum more precisely as compared with the case where only the SE image is utilized. Moreover, the merged image of both of the images is acquired in an appropriate manner. This merged image's appropriate acquisition allows both of the scum's detection and the pattern's dimension measurement to be effectively executed based on the single piece of image. Also, in the above-described processing steps, at the time of acquiring the BSE image, the electron beam's scanning direction is set into the direction that becomes parallel to the pattern. This parallel setting also makes it possible to detect many of the BSEs that are relatively attributed to the scum with respect to the pattern's edge.

In addition to these features, the following scum detection is also executable: Namely, first, a scum-existing region is judged by utilizing the BSE image. After that, the SE-image-utilized scum detection is performed with respect to this scum-existing region. As was exactly described earlier, the utilization of the BSE image makes it relatively easier to detect a scum as compared with that of the SE image. Consequently, it is effective and preferable to make the region judgment in such a manner that the BSE-image-based rough detection is performed first.

The above-described description has been given in association with the embodiments. It is apparent for those who are skilled in the art, however, that the present invention is not limited thereto, and that a variety of modifications and amendments can be made within the spirit of the present invention and the scope of the appended claims.

REFERENCE SIGNS LIST

201 SEM
202 electron beam
203 sample
204 secondary-electron detector
205 backscattered-electron detector 1
206 backscattered-electron detector 2
207 A/D converter
208 memory
209 CPU
210 image processing hardware
211 display device
212 recipe creation device
301, 302, 303 circuit patterns
304, 305 scums
306, 307, 308, 309 edge branch points
400 coordinate information
401, 402 circuit patterns
500 image data's inspection coordinate
501 evaluation area
503 pseudo contour
3101 pattern
3102 roughness of pattern's surface
3201 design data
3202 SEM image
3203 scum
3401, 3601, 4301, 4405 patterns
3402 groove portion 3403 arrow for indicating pattern-parallel direction
3601 pattern
3602 washing solution
4001 patterns
4002, 4003, 4004 scums
4005, 4303 length-measurement locations
4006 electron beam's scanning direction
4007, 4008 scum's luminance profiles
4101 scum's contour-line data
4102, 4103, 4104 electron beam's scanning directions, and profiles to be formed
4302 scum

The invention claimed is:

1. An image processing apparatus, comprising:
a control device including processing circuitry and a non-transitory memory storing a program,
wherein, the program, when executed by the processing circuitry, causes the control device to:
detect a specific-shaped pattern on contour-line data that is extracted from an image, and detect edge branch points, an edge associated with each of said edge branch points branching off in at least three or more directions at each of said edge branch points, and
identify said detected edge branch points on the basis of a predetermined condition.

2. The image processing apparatus according to claim 1, wherein the program, when executed by the processing circuitry, further causes the control device to store information about said branch points together with coordinate data on said branch points into a non-transitory storage medium.

3. The image processing apparatus according to claim 1, wherein the program, when executed by the processing circuitry, further causes the control device to store information on the number of said branch points into a non-transitory storage medium.

4. The image processing apparatus according to claim 1, wherein the program, when executed by the processing circuitry, further causes the control device to search for said specific-shaped pattern by using templates, and detect said branch points selectively for a predetermined region included within said contour-line data.

5. An image processing apparatus, comprising:
a control device including processing circuitry and a non-transitory memory storing a program,
wherein, the program, when executed by the processing circuitry, causes the control device to:
search for a specific-shaped pattern by using templates on contour-line data that is extracted from an image:
execute identification of each section of said contour line on the basis of matching between said contour-line data and design data on said contour line;
execute detection of edge branch points on said contour-line data identified on each section basis, an edge associated with each of said edge branch points branching off in at least three or more directions at each of said edge branch points; and
identify each section of said contour line on which each of said edge branch points detected exists, and store identification information and information about said branch points in a manner of being made related with each other into a non-transitory storage medium.

6. The image processing apparatus according to claim 5, wherein the program, when executed by the processing circuitry, further causes the control device to store said information about said branch points together with coordinate data on said branch points into the non-transitory storage medium.

7. The image processing apparatus according to claim 5, wherein the program, when executed by the processing circuitry, further causes the control device to store information on the number of said branch points into the non-transitory storage medium.

8. The image processing apparatus according to claim 5, wherein the program, when executed by the processing circuitry, further causes the control device to detect said branch points selectively for a predetermined region included within said contour-line data.

9. A non-transitory memory storing a computer program for causing processing circuitry to execute detection of a specific-shaped pattern on contour-line data that is extracted from an image, wherein
said program, when executed by the processing circuitry, causes said processing circuitry to detect edge branch points, and to identify said detected edge branch points on the basis of a predetermined condition, an edge associated with each of said edge branch points branching off in at least three or more directions at each of said edge branch points.

10. The non-transitory memory according to claim 9, wherein said program, when executed by the processing circuitry, further causes said processing circuitry to store, into a non-transitory storage medium, information about said branch points together with coordinate data on said branch points.

11. The non-transitory memory according to claim 9, wherein said program, when executed by the processing circuitry, further causes said processing circuitry to store information, into a non-transitory storage medium, on the number of said branch points.

12. The non-transitory memory according to claim 9, wherein said program, when executed by the processing circuitry, further causes said processing circuitry to detect said branch points selectively for a predetermined region included within said contour-line data.

13. A non-transitory memory storing a computer program for causing processing circuitry to execute a template-used pattern matching on contour-line data that is extracted from an image, wherein
said program, when executed by the processing circuitry, causes said processing circuitry:
to identify each section of said contour line on the basis of matching between said contour-line data and design data on said contour line, to detect edge branch points on said contour-line data identified on each section basis, an edge associated with each of said edge branch points branching off in at least three or more directions at each of said edge branch points, and
to identify each section of said contour line on which each of said edge branch points detected exists and to store, into a non-transitory storage medium, identification information and information about said branch points in a manner of being made related with each other.

14. The non-transitory memory according to claim 13, wherein said program, when executed by the processing circuitry, further causes said processing circuitry to store, into said non-transitory storage medium, said information about said branch points together with coordinate data on said branch points.

15. The non-transitory memory according to claim 13,
wherein said program, when executed by the processing circuitry, further causes said processing circuitry to store information on the number of said branch points.

16. The non-transitory memory according to claim 13,
wherein said program, when executed by the processing circuitry, further causes said processing circuitry to detect said branch points selectively for a predetermined region included within said contour-line data.

17. An image processing apparatus, comprising:
a control device including processing circuitry and a non-transitory memory storing a program,
wherein, the program, when executed by the processing circuitry, causes the control device to:
detect a specific-shaped pattern on contour-line data that is extracted from an image;
inspect said specific-shaped pattern detected;
detect, of said contour-line data, an edge branch point at which an edge associated therewith branches off in at least three or more directions;
set, into said image, a region that includes an edge, said edge being formed by excluding, from said edge that branches off in said three directions, an edge that forms a pattern constituting a circuit of a semiconductor device; and then
acquire a signal waveform based on luminance within said region.

18. The image processing apparatus according to claim 17,
wherein width of said edge is measured based on said acquired signal waveform, said edge being formed by excluding said edge that forms said pattern constituting the circuit of the semiconductor device.

19. The image processing apparatus according to claim 17,
wherein said program, when executed by the processing circuitry, further causes said processing circuitry to:
detect said plurality of branch points, and, if there exists an edge that connects, of said plurality of branch points detected, at least two branch points to each other, and
acquire said signal waveform for a region that includes said edge, said signal waveform being based on said luminance of said image.

20. The image processing apparatus according to claim 17,
wherein said program, when executed by the processing circuitry, further causes said processing circuitry to acquire said signal waveform into a direction, said direction becoming perpendicular to the direction of said edge, said edge being formed by excluding said edge that forms said pattern constituting the circuit of the semiconductor device, said signal waveform being based on said luminance of said image within said region.

21. The image processing apparatus according to claim 17,
wherein said program, when executed by the processing circuitry, further causes said processing circuitry to acquire said image within said region, and acquire said signal waveform of said acquired image by performing a scanning with a charged-particle beam in such a manner that said charged-particle beam intersects with said edge, said edge being formed by excluding said edge that forms said pattern constituting the circuit of the semiconductor device.

22. The image processing apparatus according to claim 17,
wherein said program, when executed by the processing circuitry, further causes said processing circuitry to acquire said image within said region, and acquire said signal waveform of said acquired image by performing a scanning with a charged-particle beam in such a manner that, within said region, said charged-particle beam is perpendicular to the longitudinal direction of said edge, said edge being formed by excluding said edge that forms said pattern constituting the circuit of the semiconductor device.

23. The image processing apparatus according to claim 17,
wherein said program, when executed by the processing circuitry, further causes said processing circuitry to acquire said image within said region, and acquire said signal waveform of said acquired image by performing a scanning with a charged-particle beam in such a manner that, within said region, said charged-particle beam is always perpendicular to the longitudinal direction of said edge, said edge being formed by excluding said edge that forms said pattern constituting the circuit of the semiconductor device.

24. An image processing apparatus, comprising:
a control device including processing circuitry and a non-transitory memory storing a program,
wherein, the program, when executed by the processing circuitry, causes the control device to:
detect a specific-shaped pattern on contour-line data that is extracted from an image;
inspect said specific-shaped pattern detected;
detect an edge branch point at which an edge associated therewith branches off in at least three or more directions;
set, into said image, a region that includes an edge, said edge being formed by excluding, from said edge that branches off in said three directions, an edge that forms a pattern constituting a circuit of a semiconductor device;
create a line profile that is based on said image signal within said region; and
measure width of said edge on the basis of said created line profile, said edge being formed by excluding said edge that forms said pattern constituting the circuit of the semiconductor device.

25. The image processing apparatus according to claim 24,
wherein said program, when executed by the processing circuitry, further causes said processing circuitry to create said line profile into a direction, said direction becoming perpendicular to the direction of said edge, said edge being formed by excluding said edge that forms said pattern constituting the circuit of the semiconductor device, said line profile being based on said image signal within said region.

* * * * *